United States Patent
Maeda

(10) Patent No.: US 8,483,003 B2
(45) Date of Patent: Jul. 9, 2013

(54) SEMICONDUCTOR DEVICE AND DATA PROCESSOR

(75) Inventor: Noriaki Maeda, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 269 days.

(21) Appl. No.: 13/038,374

(22) Filed: Mar. 1, 2011

(65) Prior Publication Data

US 2011/0216610 A1 Sep. 8, 2011

(30) Foreign Application Priority Data

Mar. 2, 2010 (JP) ................................ 2010-044906

(51) Int. Cl.
*G11C 5/14* (2006.01)

(52) U.S. Cl.
USPC .. 365/226; 365/218; 365/189.05; 365/230.08

(58) Field of Classification Search
USPC .......................... 365/226, 218, 189.05, 230.08
See application file for complete search history.

(56) References Cited

U.S. PATENT DOCUMENTS

| | | | | |
|---|---|---|---|---|
| 4,890,263 A | * | 12/1989 | Little | ............................ 365/218 |
| 2006/0056229 A1 | | 3/2006 | Maeda et al. | |
| 2006/0262628 A1 | | 11/2006 | Nii et al. | |

FOREIGN PATENT DOCUMENTS

| | | |
|---|---|---|
| JP | 2006-85786 A | 3/2006 |
| JP | 2007-4960 A | 1/2007 |

* cited by examiner

*Primary Examiner* — Jason Lappas
(74) *Attorney, Agent, or Firm* — Miles & Stockbridge P.C.

(57) ABSTRACT

Disclosed is a semiconductor device in which substantial enhancement of a write margin without degradation of a static noise can be achieved while obviating an increase in physical circuit size. There are disposed a plurality of power supply lines for feeding a power supply voltage to each column of static memory cells that use complementary bit lines in common; a plurality of power switches, each being disposed for each of the power supply lines; and a plurality of short-circuit switches, each being so arranged as to provide short-circuiting between output nodes of different power switches. When a complementary bit line select signal indicates an unselected level, the power switch corresponding thereto is put in an ON state so that, in a read operation, a power supply voltage is fed via the short-circuit switch concerned to a selected memory cell column from the power supply line corresponding to a memory cell being unselected, or in a write operation, a power supply voltage fed via the short-circuit switch concerned to a selected memory cell column is stopped.

12 Claims, 24 Drawing Sheets

SEMICONDUCTOR DEVICE AND DATA PROCESSOR

CROSS-REFERENCE TO RELATED APPLICATIONS

The disclosure of Japanese Patent Application No. 2010-44906 filed on Mar. 2, 2010 including the specification, drawings and abstract is incorporated herein by reference in its entirety.

BACKGROUND OF THE INVENTION

The present invention relates to semiconductor devices, and more particularly to a technique that is effectively applicable to a semiconductor device including a static random access memory (SRAM).

In a static random access memory (hereinafter referred to just as an SRAM), a memory cell thereof has a performance characteristic known as a static noise margin. The static noise margin represents the degree of stability in retention with respect to data stored in each memory cell. As the static noise margin is increased, the degree of stability in data retention becomes higher, whereas a write of inverted data over existing data retained in memory cells becomes more burdensome. To solve this problem, it is required to enhance a write margin without sacrificing a static noise margin by reducing a power supply voltage applied to memory cells in a write operation to a level lower than that in a read operation, as proposed in Patent Documents 1 and 2 indicated below.

In the Patent Document 1, there is disclosed a circuit configuration wherein power supply lines to memory cells are coupled to complementary bit lines through use of coupling capacitance elements in order to reduce a power supply voltage applied to memory cells in a write operation to a level lower than that in a read operation. Further, the Patent Document 1 discloses another circuit configuration wherein a power supply line is provided for each complementary bit line, and a power switch of each power supply line is controlled by using a logical AND signal of a complementary bit line select signal and a write signal.

In Patent Document 2 indicated below, there is disclosed a circuit configuration wherein a power supply line is provided for each complementary bit line, and a power switch of each power supply line is controlled by a logical AND signal corresponding to a potential of a pair of complementary bit lines. This configuration is based on the condition that amplification on the complementary bit lines is performed on the power supply voltage side in a read operation while a maximum amplitude of power supply voltages is used in a write operation.

Related Art References—Patent Documents

Patent Document 1: Japanese Unexamined Patent Publication No. 2007-004960
Patent Document 2: Japanese Unexamined Patent Publication No. 2006-085786

SUMMARY OF THE INVENTION

Regarding the disclosures contained in the above patent documents, in the circuit configuration wherein the coupling capacitance elements are used, it is inevitable to incur an adverse effect on a read operation and an increase in chip occupancy area due to the provision of a coupling capacitance element for each complementary bit line. In each of the circuit configurations wherein logical ANDing is performed for each power supply line corresponding to a complementary bit line, it is required to dispose a logical AND gate for each power supply line, giving rise to an disadvantageous increase in area overhead.

It is therefore an object of the present invention to provide a semiconductor device that allows substantial enhancement of a write margin without degradation of a static noise while obviating an increase in physical circuit size.

The above and other objects, novel features, and advantages of the present invention will become more apparent from the following detailed description with reference to the accompanying drawings.

The representative aspects of the present invention are briefed below:

A power switch is disposed for each power supply line for feeding a power supply voltage to each column of static memory cells that use complementary bit lines in common, and a short-circuit switch is so arranged as to provide short-circuiting between output nodes of different power switches. When a complementary bit line select signal indicates an unselected level, the power switch corresponding thereto is put in an ON state so that, in an read operation, a power supply voltage is fed via the short-circuit switch concerned to a selected memory cell column from the power supply line corresponding to a memory cell column being unselected, or in a write operation, a power supply voltage fed via the short-circuit switch concerned to a selected memory cell column is stopped.

Thus, a power supply voltage applied to memory cells in a write operation can be reduced to a level lower than that in a read operation, thereby making it possible to enhance a write margin without the need to provide a logic gate such as an AND gate for each complementary bit line.

To sum up, the following advantageous effect is provided according to the representative aspects of the present invention:

A write margin can be enhanced without degradation of a static noise margin while obviating an increase in physical circuit size.

DETAILED DESCRIPTION OF THE PREFERRED EMBODIMENTS

1. Overviews of the Preferred Embodiments

Figure 1:
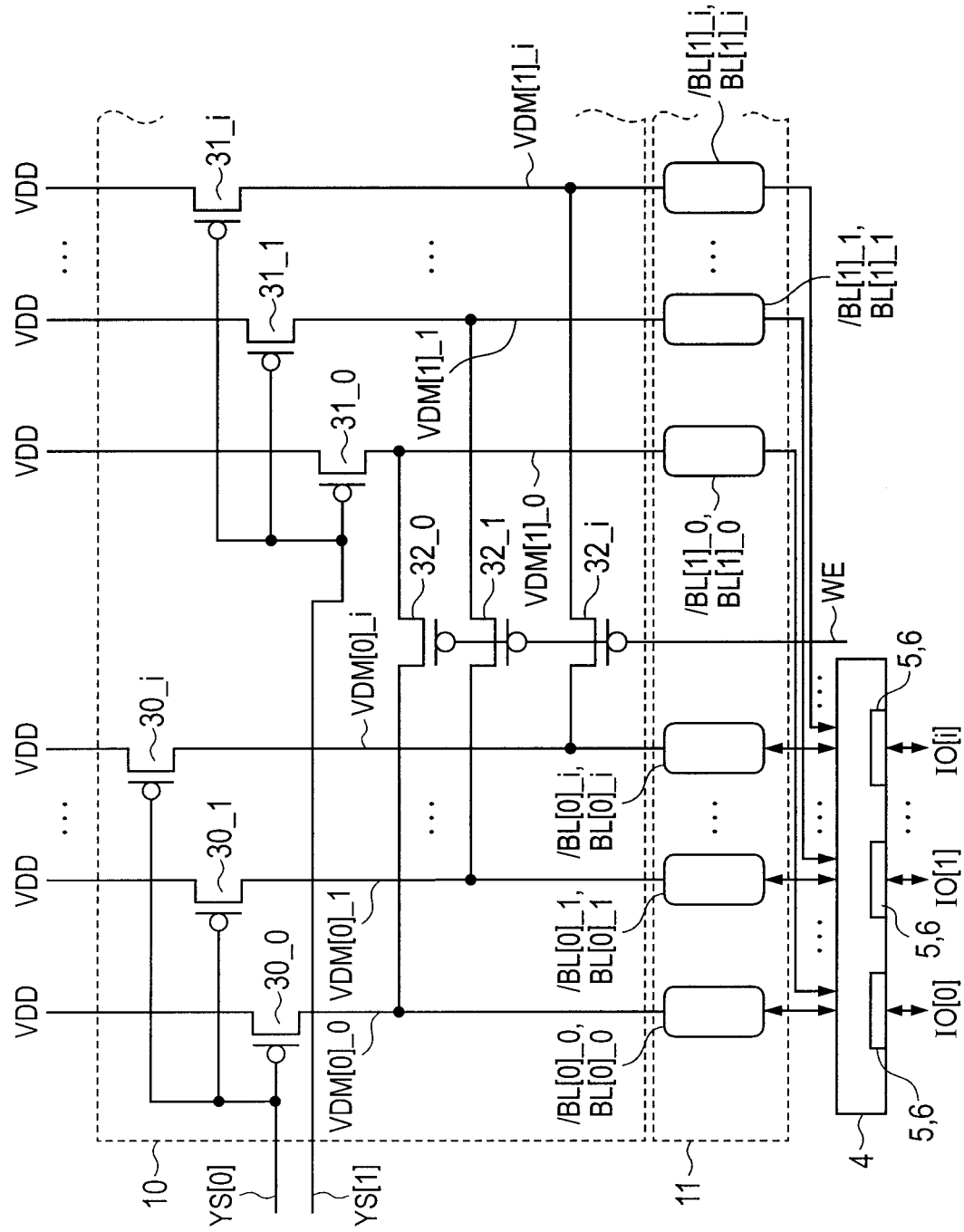
FIG. 1 is an explanatory diagram concerning the principle of configuration of a power supply circuit.

First, the present invention will be described below regarding the overviews of representative preferred embodiments thereof. It is to be noted that, in the following description of the overviews of the representative preferred embodiments, parenthesized reference characters are used for illustrative purposes only and designate respective parts that are included in the concepts of corresponding component elements identified by reference characters in the accompanying drawings.

[1] <Power Switches and Short-circuit Switches>

In accordance with a representative preferred embodiment of the present invention, there is provided a semiconductor device comprising: a plurality of word lines disposed row-wise (WL[0] to WL[n]); a plurality of complementary bit lines disposed column-wise (/BL[0], BL[0] to /BL[m], BL[m]; /BL[0]_0, BL[0]_0 to /BL[0]_i, BL[0]_i; /BL[1]_0, BL[1]_0 to /BL[1]_i, BL[1]_i; and so forth); a plurality of static memory cells (2) disposed correspondingly to the word lines and the complementary bit lines; an address decoder (7) for decoding address signals to produce complementary bit line select signals (YS[0] to YS[m]; YS[0], YS[1], and so forth); a plurality of power supply lines (VDM[0] to VDM[m], VDM[0]_0 to VDM[0]_i, VDM[1]_0 to VDM[1]_i, and so forth) for feeding a power supply voltage to each column of memory cells that use the complementary bit lines in common; and a power supply circuit (power supply control circuit) (10, 10A to 10K, 10M, 10N) for applying a power supply voltage (VDD, VSS in FIG. 23) to each column of memory cells through the power supply lines. The power supply circuit comprises: a plurality of power switches (30, 31, 30_0 to 30_i, 31_0 to 31_i), each being disposed for each of the power supply lines; and a plurality of short-circuit switches (32, 32_0 to 32_i), each being so arranged as to provide short-circuiting between output nodes of different power switches. When the complementary bit line select signal concerned indicates an unselected level, the power switch corresponding thereto is put in an ON state so that, in a read operation, a power supply voltage is fed via the short-circuit switch concerned to a selected memory cell column from the power supply line corresponding to a memory cell column being unselected, or in a write operation, a power supply voltage fed via the short-circuit switch concerned to a selected memory cell column is stopped.

In the arrangement mentioned above, since each power switch for memory cells is switch-controlled with respect to each complementary bit line, it is not required to dispose a logic gate such as an AND gate. With the provision of the short-circuit switch for power supply, switching control is performed for the power switch and the short-circuit switch through use of a complementary bit line select signal and a write instruction signal that are available intrinsically, thereby reducing a power supply voltage applied to memory cells in a write operation to a level lower than that in a read operation. Thus, it is possible to enhance a write margin without degradation of a static noise margin while obviating an increase in physical circuit size.

[2] <Arrangement with Minimum Numbers of Power Switches and Short-circuit Switches>

In accordance with another representative preferred embodiment of the present invention, there is provided a semiconductor device comprising: a plurality of word lines (WL[0] to WL[n]); a plurality of complementary bit lines (/BL[0], BL[0] to /BL[m], BL[m]; /BL[0]_0, BL[0]_0 to /BL[0]_i, BL[0]_i; /BL[1]_0, BL[1]_0 to /BL[1]_i, BL[1]_i; and so forth); a plurality of static memory cells (2) disposed correspondingly to the word lines and the complementary bit lines; an address decoder (7) for decoding address signals to produce complementary bit line select signals (YS[0] to YS[m]; YS[0], YS[1], and so forth); a write circuit (5) for feeding a write signal to each memory cell from a complementary bit line selected by a complementary bit line select signal; and a plurality of power supply lines (VDM[0] to VDM[m], VDM[0]_0 to VDM[0]_i, VDM[1]_0 to VDM[1]_i, and so forth) for feeding a power supply voltage to each group of memory cells that use the complementary bit lines in common. Further, the semiconductor device includes: a plurality of power switches (30, 31, 30_0 to 30_i, 31_0 to 31_i), each being disposed for each power supply line corresponding to a complementary bit line selected by a complementary bit line select signal for use in common at least, and being so arranged as to be put in an ON state when an unselected level is indicated by the complementary bit line select signal concerned or in an OFF state when a selected level is indicated thereby; and a plurality of short-circuit switches (32, 32_0 to 32_i), each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least.

In the arrangement mentioned above, since each power switch for memory cells is switch-controlled with respect to each complementary bit line, it is not required to dispose a logic gate such as an AND gate. With the provision of the short-circuit switch for power supply, switching control is performed for the power switch and the short-circuit switch through use of a complementary bit line select signal and a write instruction signal that are available intrinsically, thereby reducing a power supply voltage applied to memory cells in a write operation to a level lower than that in a read operation. Thus, it is possible to enhance a write margin without degradation of a static noise margin while obviating an increase in physical circuit size.

For implementation of the above arrangement, it is required, in principle, that each power switch should be disposed for each power supply line corresponding to a complementary bit line selected by a complementary bit line select signal for use in common at least, and that each short-circuit switch should be arranged to provide coupling between an output node of each power switch and an output node of at least one of the other power switches in such a fashion that the output nodes of the power switches to be coupled mutually correspond to complementary bit lines selected by different complementary bit line select signals at least. Thus, it is possible to reduce the number of power switches and the number of short-circuit switches to a required minimum.

[3] <Provision of Redundant Short-Circuit Switches>

In the semiconductor device mentioned in item 2, there are further included a plurality of redundant short-circuit switches each being series-coupled to the short-circuit switch; the redundant short-circuit switch being disposed for providing coupling between an output node of each power switch and an output node of at least one of the other power switches, and being so arranged as to be put in an OFF state in response to a write operation instruction from the write circuit or in an ON state in response to a write non-operation instruction therefrom.

The provision of the redundant short-circuit switch has no effect on the data retaining function of each memory cell with respect to power supply voltage feeding to the memory cell. However, this kind of redundant short-circuit switch may serve to ensure continuity or uniformity in transistor disposition associated with a layout of the short-circuit switches.

[4] <Retention Current>

In the semiconductor device mentioned in item 2, there are further included a plurality of retention switches (50, 51), each being disposed in parallel with the power switch so as to provide a mutual conductance smaller than that of the power switch, wherein, with the power switch in an OFF state at least, a retention current for data stored in memory cells is fed to a corresponding power supply line.

With the power switch in an OFF state, a certain degree of power feeding is allowed. Thus, even if a write operation time is prolonged, it can be ensured that write-unselected memory cells in a write-selected column do not become incapable of retaining data therein.

[5] <Retention Voltage>

In the semiconductor device mentioned in item 2, there is further included a series circuit comprising: a plurality of first transistors (60, 61, 70, 71) disposed in parallel with the power supply lines for performing complementary switching operation with respect to corresponding power switches; and a plurality of second transistors (63, 65, 66, 67, 73, 74, 72, 64, 62) for performing complementary switching operation with respect to corresponding short-circuit switches; wherein, in a conducting state, the series circuit feeds a retention voltage to corresponding power supply lines for ensuring data retention in memory cells.

With the power switch in an OFF state, a certain degree of power feeding is allowed. Thus, even if a write operation time is prolonged, it can be ensured that write-unselected memory cells in a write-selected column do not become incapable of retaining data therein.

[6] <Second Transistors Arranged for Use in Common>

In the semiconductor device mentioned in item 3, each of the first transistors is disposed for each power supply line, and each of the second transistors is arranged for use in common to the first transistors (72, 65, 62).

The arrangement of the second transistors for use in common contributes to a reduction in chip area.

[7] <Regularity of Layout Patterning>

In the semiconductor device mention in item 2, each of the short-circuit switches (32, 36, 35) is disposed between mutually adjacent power supply lines.

The above arrangement serves to ensure continuity or uniformity in transistor disposition associated with a layout of the short-circuit switches.

[8] <Positive Potential of Power Supply Voltage>

In the semiconductor device mentioned in item 2, each of the power switches and the short-circuit switches is formed by using a p-channel MOS transistor, the power supply voltage is a positive potential voltage (VDD) higher than a circuit ground voltage, and the power supply circuit is disposed in the course of a path for feeding the power supply voltage to the memory cells. Each of the memory cells comprises a memory part in which inputs and outputs of two CMOS inverter circuits are cross-coupled, and a pair of address selection MOSFET transistors each being disposed between the memory part and the complementary bit line with a gate thereof coupled to the word line.

The use of a p-channel MOS transistor in the formation of the short-circuit switch is advantageous in that dynamic switching control can be performed at higher speed in operation of an ordinary type of memory cell wherein a load capacity of VDD is smaller than that of VSS. Further, in view of an ordinary cell layout configuration, the use of a p-channel MOS transistor is also advantageous in that layout patterning can be facilitated because of easy separation of VDD for each column.

If the p-channel MOS transistor is replaced with an n-channel MOS transistor, a voltage to be applied is decreased to an extent corresponding to a threshold voltage of the MOS transistor concerned.

[9] <Ground Potential of Power Supply Voltage>

In the semiconductor device mentioned in item 2, each of the power switches and the short-circuit switches is formed by using an n-channel MOS transistor, the power supply voltage is a circuit ground voltage (VSS) lower than a positive potential voltage, and the power supply circuit is disposed in the course of a path for drawing a current from the memory cells with respect to the power supply voltage. Each of the memory cells comprises a memory part in which inputs and outputs of two CMOS inverter circuits are cross-coupled, and a pair of address selection MOSFET transistors each being disposed between the memory part and the complementary bit line with a gate thereof coupled to the word line.

[10] <Arrangement for Bitwise Write Operation>

Figure 20:
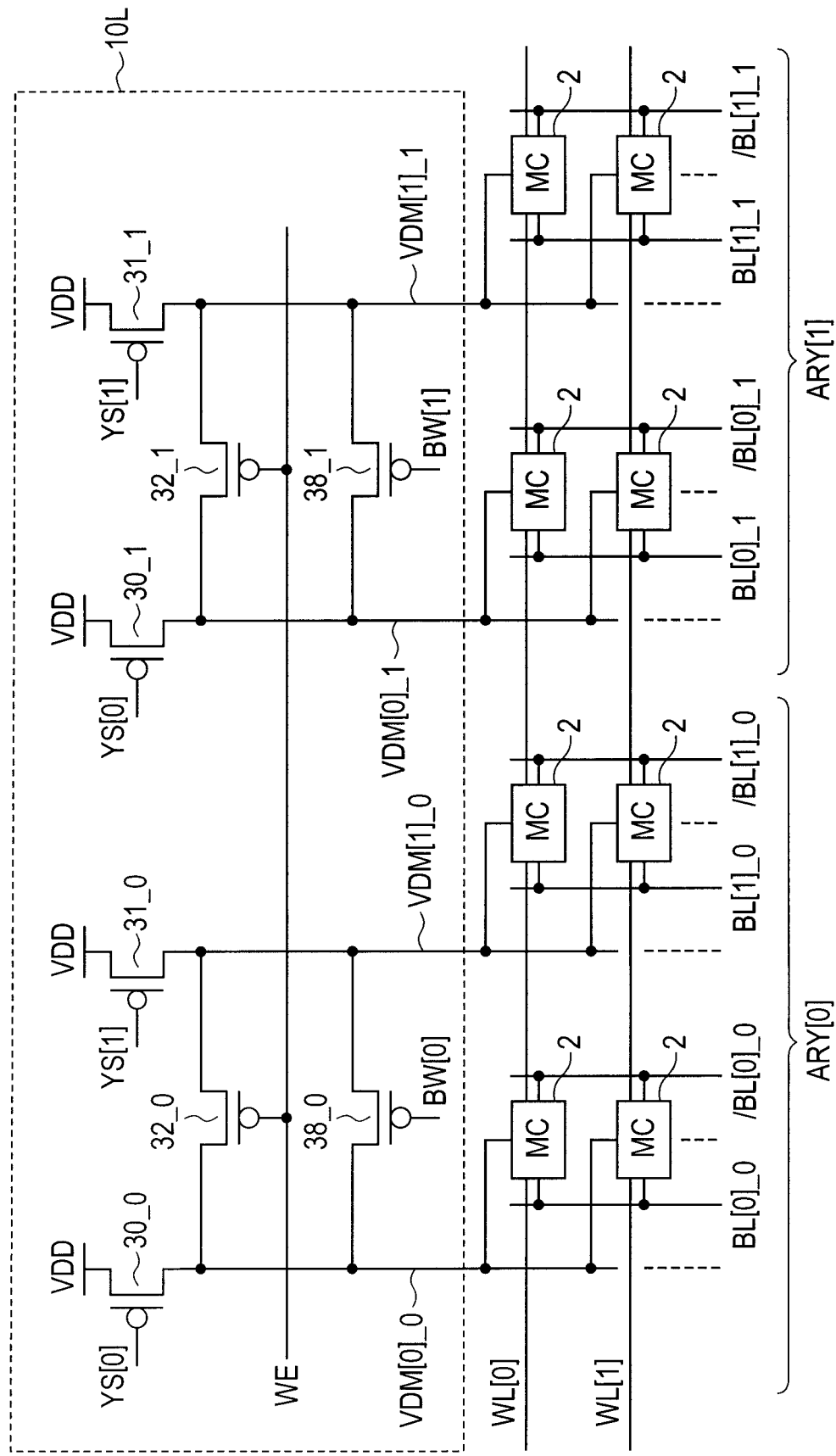
FIG. 20 is a circuit diagram illustrating a power supply circuit configuration wherein a power shut-off condition established by turning off a short-circuit switch is canceled for a column specified by a mask bit to provide write masking thereon.

Furthermore, in accordance with another representative preferred embodiment of the present invention, there is provided a semiconductor device comprising: a plurality of word lines (WL[0] to WL[n]), a plurality of complementary bit lines (/BL[0]_0, BL[0]_0 to /BL[0]_1, BL[0]_1; /BL[1]_0, BL[1]_0 to /BL[1]_1, BL[1]_1); a plurality of static memory cells (2) disposed correspondingly to the word lines and the complementary bit lines; an address decoder (7) for decoding address signals to produce complementary bit line select signals for parallel selection of a plurality of complementary bit lines; a write circuit (5A) for feeding a write signal to each memory cell from a complementary bit line selected by a complementary bit line select signal, with the exclusion of complementary bit lines that are write-inhibited under the direction of a mask signal; and a plurality of power supply lines for feeding a power supply voltage to each group of memory cells that use the complementary bit lines in common. Further, the semiconductor device includes: a plurality of power switches (30_0 to 30_1, 31_0 to 31_1), each being disposed for each power supply line corresponding to a complementary bit line selected by a complementary bit line select signal for use in common at least, and being so arranged as to be put in an ON state when an unselected level is indicated by the complementary bit line select signal concerned or in an OFF state when a selected level is indicated thereby; a plurality of first short-circuit switches (32_0 to 32_1), each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least; and a plurality of second short-circuit switches (38_0, 38_1), each being disposed in parallel with each of the first short-circuit switches, and being so arranged as to be put in an ON state in response to a masking instruction by a corresponding mask bit of the mask signal or in an OFF state in response to an unmasking instruction thereby (FIG. 20).

Thus, advantageous effects similar to those in item 2 can also be provided in a case where a bitwise write operation is performed according to the mask signal.

[11] <Data Processor>

Still further, in accordance with another representative preferred embodiment of the present invention, there is provided a data processor comprising: a CPU (102) for fetching and carrying out instructions; a first memory block (103) to be accessed by the CPU; and a data processing unit (104) including a second memory block (104A) and being arranged to perform data processing operations under control of the CPU. Each of the first memory block and the second memory block comprises: a plurality of word lines disposed row-wise; a plurality of complementary bit lines disposed column-wise; a plurality of static memory cells disposed correspondingly to the word lines and the complementary bit lines; an address decoder for decoding address signals to produce complementary bit line select signals; a plurality of power supply lines for feeding a power supply voltage to each column of memory cells that use the complementary bit lines in common; and a power supply circuit for applying a power supply voltage to each column of memory cells through the power supply lines. The power supply circuit comprises: a plurality of power switches, each being disposed for each of the power supply lines; and a plurality of short-circuit switches, each being so arranged as to provide short-circuiting between output nodes of different power switches. When the complementary bit line select signal concerned indicates an unselected level, the power switch corresponding thereto is put in an ON state so that, in a read operation, a power supply voltage is fed via the short-circuit switch concerned to a selected memory cell column from the power supply line corresponding to a memory cell column being unselected, or in a write operation, a power supply voltage fed via the short-circuit switch concerned to a selected memory cell column is stopped.

Thus, advantageous effects similar to those in item 1 can also be provided for the first and second memory blocks. Hence, in a case where a write margin is enhanced by disposing the first and second memory blocks in a semiconductor chip, it is possible to obviate an increase in physical chip size.

[12] <Data Processor>

Moreover, in accordance with another representative preferred embodiment of the present invention, there is provided a data processor comprising: a CPU for fetching and carrying out instructions; a first memory block to be accessed by the CPU; and a data processing unit including a second memory block and being arranged to perform data processing operations under control of the CPU. Each of the first memory block and the second memory block comprises: a plurality of word lines; a plurality of complementary bit lines; a plurality of static memory cells disposed correspondingly to the word lines and the complementary bit lines; an address decoder for decoding address signals to produce complementary bit line select signals; a write circuit for feeding a write signal to each memory cell from a complementary bit line selected by a complementary bit line select signal; and a plurality of power supply lines for feeding a power supply voltage to each group of memory cells that use the complementary bit lines in common. Further, there are included: a plurality of power switches, each being disposed for each power supply line corresponding to a complementary bit line selected by a complementary bit line for use in common at least, and being so arranged as to be put in an ON state when an unselected level is indicted by the complementary bit line select signal concerned or in an OFF state when a selected level is indicated thereby; and a plurality of short-circuit switches, each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least.

Thus, advantageous effects similar to those in item 2 can also be provided for the first and second memory blocks. Hence, in a case where a write margin is enhanced by disposing the first and second memory blocks in a semiconductor chip, it is possible to obviate an increase in physical chip size.

[13] <Accelerator>

In the data processor mentioned in item 12, the data processing unit is an accelerator used for the CPU.

[14] <Microcomputer>

The data processor mentioned in item 12 is a microcomputer configured in the form of a single semiconductor chip.

2. Details of the Preferred Embodiments

The following further describes the details of preferred embodiments of the present invention.

<1. Overall Configuration of SRAM>

Figure 2:
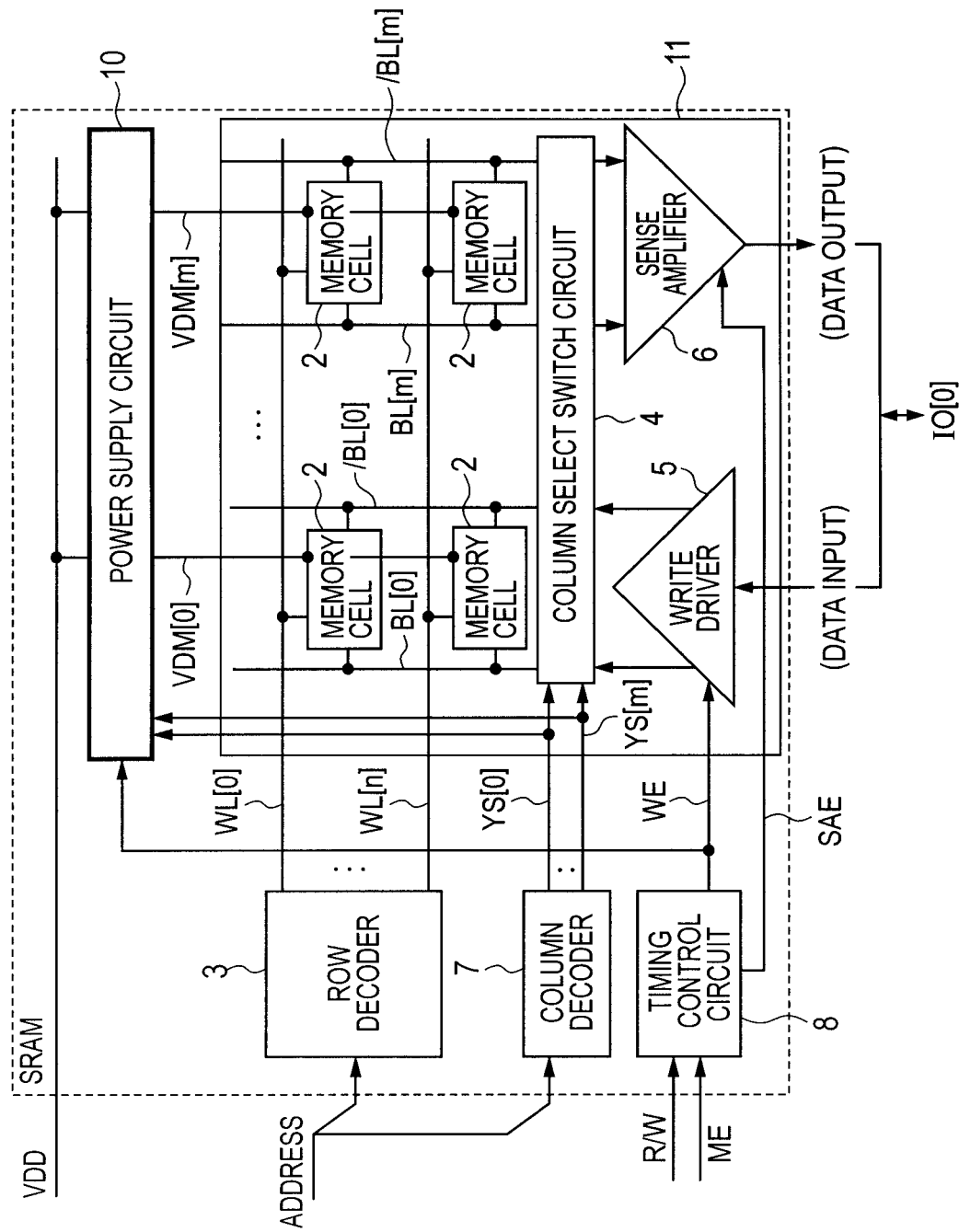
FIG. 2 is a block diagram of a static RAM according to the present invention.
Figure 3:
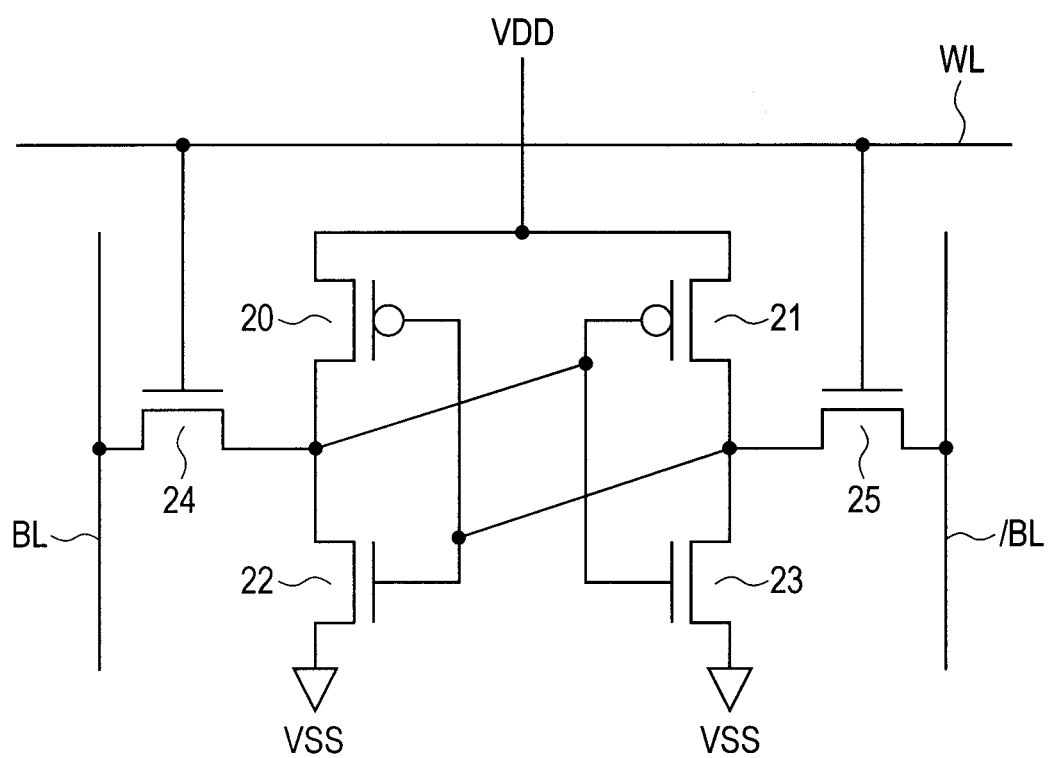
FIG. 3 is a circuit diagram showing a CMOS static memory cell.

Referring to FIG. 2, there is shown a block diagram of a static RAM 1 according to the present invention. In a memory cell array 11 in FIG. 2, as representatives for illustrative purposes only, there are indicated four memory cells (MC) 2, two word lines WL[0] and WL[n] corresponding thereto, a pair of complementary bit lines /BL[0], BL[0], and a pair of complementary bit lines /BL[m], BL[m]. As illustrated in FIG. 3, the memory cell 2 comprises a memory part and a pair of address selection n-channel MOSFET transistors 24, 25. The memory part of the memory cell 2 is a latch (flip-flop) circuit in which inputs and outputs of two CMOS inverter circuits including a pair of p-channel MOSFET transistors 20, 21 and a pair of n-channel MOSFET transistors 22, 23 are cross-coupled. The input/output cross-coupling thus formed is used as a memory node. The address selection n-channel MOSFET transistors 24, 25 are disposed between the memory part and corresponding complementary bit lines /BL, BL, respectively. A gate of each of the address selection n-channel MOSFET transistors 24, 25 is coupled to a corresponding word line WL. Each CMOS inverter circuit included in the memory part performs an inversion operation with respect to a power supply voltage VDD and a ground voltage VSS.

One of word lines WL[0] to WL[n] is selected by a row decoder 3, which is provided with a word driver. A row address signal contained in an address signal is supplied to the row decoder 3. A pair of complementary bit lines selected from /BL[0], BL[0] to /BL[m], BL[m] is coupled to a write driver 5 or a sense amplifier 6 via a column select switch circuit 4. More specifically, upon receipt of one of complementary bit line select signals (column select signals) YS[0] to YS[m] from a column decoder 7, the column select switch circuit 4 selects a pair of complementary bit lines from /BL[0], BL[0] to /BL[m], BL[m]. Thus, the selected pair of complementary bit lines is coupled to an output terminal of the write driver 5 or an input terminal of the sense amplifier 6.

A timing control circuit 8 is supplied with a read/write signal RW and a memory enable signal ME. In the timing control circuit 8, a write enable signal WE and a sense amplifier enable signal SAE are produced according to the levels of the memory enable signal ME and the read/write signal R/W, though not particularly limited thereto. When the memory enable signal ME turns to a level indicating an instruction for memory operation, the write enable signal WE or the sense amplifier enable signal SAE is made active according to the level of the read/write signal R/W. In an instance where the memory enable signal ME has a level indicating an instruction for memory non-operation, all the decoded outputs of the row decoder 3 and the column decoder 7 are set to an unselected level.

The write enable signal WE is fed to the write driver 5 for activation thereof. More specifically, a word line is selected by the row decoder 3, a pair of complementary bit lines is selected by the column decoder 7 through use of the column select switch circuit 4, and the write driver 5 is activated. Then, a data input signal is written into a memory cell 2 coupled to the selected word line and the selected pair of complementary bit lines. The sense amplifier enable signal SAE is used to activate the sense amplifier 6. In a manner similar to that mentioned above, a word line is selected by the row decoder 3, a pair of complementary bit lines is selected by the column decoder 7 through use of the column select switch circuit 4, and the sense amplifier 6 is activated. Then, a read signal regarding a memory cell 2 coupled to the selected word line and the selected pair of complementary bit lines is applied to the sense amplifier 6. Thus, the differential signal concerned is sensed and amplified for data output reading.

It is required to ensure a static noise margin of unselected memory cells coupled to unselected complementary bit lines while enhancing a write margin of memory cells corresponding to selected complementary bit lines. For this purpose, memory cell power supply lines VDM[0] to VDM[m] are disposed correspondingly to the complementary bit lines BL[0], BL[0] to /BL[m], BL[m], respectively. The memory cell power supply line VDM[0] indicated illustratively as a representative power supply line in FIG. 2 is used to feed a power supply voltage to a memory cell 2 coupled to a pair of complementary bit lines /BL[0], BL[0] corresponding thereto. Likewise, the memory cell power supply line VDM[m] indicated illustratively as a representative power supply line in FIG. 2 is used to feed a power supply voltage to a memory cell 2 coupled to the complementary bit lines /BL[m], BL[m] corresponding thereto. The power supply lines VDM[0] to VDM[m] are furnished with a power supply voltage generated by a power supply circuit 10 that receives an external power supply voltage VDD.

<2. Principle of Configuration of Power Supply Circuit>

Referring to FIG. 1, there is shown an explanatory diagram concerning the principle of configuration of the power supply circuit 10. In FIG. 1, an exemplary arrangement related to two column select signals YS[0] and YS[1] is illustrated. With one column select signal, "i+1" complementary bit lines are subjected to parallel selection, and thus, data writing or reading is performed in units of "i+1" bits. More specifically, with the column select signal YS[0], the following complementary bit lines are selectable; /BL[0]_1, BL[0]_0 to /BL[0]_i, BL[0]_i. For memory cells 2 in each bit column, the following power supply lines are used in common; VDM[0]_0 to VDM[0]_i. Likewise, with the column select signal YS[1], the following complementary bit lines are selectable; /BL[1]_1, BL[1]_0 to /BL[1]_i, BL[1]_i. For memory cells 2 in each bit column, the following power supply lines are used in common; VDM[1]_0 to VDM[1]_i. In FIG. 2, there is indicated a pair of complementary bit lines to be selected by one column select signal. It is to be understood that, with reference to FIGS. 1 and 2 in combination, a plurality of memory cell arrays shown in FIG. 2 are disposed in the perpendicular direction across FIG. 1 so as to allow parallel input/output of a plurality of bits. In FIG. 1, a total of "i+1" bits of external input/output data IO[0] to IO[i] are assumed to be provided.

In the exemplary configuration shown in FIG. 1, the power supply circuit 10 comprises a plurality of power switches 30_0 to 30_i disposed correspondingly to the power supply lines VDM[0]_0 to VDM[0]_i, a plurality of power switches 31_0 to 31_i disposed correspondingly to the power supply lines VDM[1]_0 to VDM[1]_i, and a plurality of short-circuit switches 32_0 to 32_i (read assist switches, read assist switches, read operation assist switches, power supply assist switches) for short-circuiting between output nodes of different power switches. Each of these switches is formed by using a p-channel MOS transistor in the exemplary configuration shown in FIG. 1.

The power switches 30_0 to 30_i are switch-controlled by the column select signal YS[0]. In a column-unselected state, each of the power switches 30_0 to 30_i feeds a power supply voltage VDD to a corresponding one of the power supply lines VDM[0]_0 to VDM[0]_i. In a column-selected state, each of the power switches 30_0 to 30_i shuts off a power supply voltage VDD to a corresponding one of the power supply lines VDM[0]_0 to VDM[0]_i. Likewise, the power switches 31_0 to 31_i are switch-controlled by the column select signal YS[1]. In a column-unselected state, each of the power switches 31_0 to 31_i feeds a power supply voltage VDD to a corresponding one of the power supply lines VDM[1]_0 to VDM[1]_i. In a column-selected state, each of the power switches 31_0 to 31_i shuts off a power supply voltage VDD to a corresponding one of the power supply lines VDM [1]_0 to VDM[1]_i.

Each of the short-circuit switches 32_0 to 32_i is a switching element for providing coupling between an output node of each power switch and an output node of at least one of the other power switches. Each short-circuit switch is put in an OFF state in response to a write operation instruction (high level) of the write enable signal WE or in an ON state in response to a write non-operation instruction thereof. The short-circuit switches are arranged in such a fashion that the output nodes of the power supply switches to be coupled mutually correspond to column bit lines (complementary bit lines) selected by different column select signals at least. For example, in FIG. 1, the short-circuit switch 32_0 is used for coupling between the power supply lines VDM[0]_0 and VDM[1]_0, the short-circuit switch 32_1 is used for coupling between the power supply lines VDM[0]_1 and VDM[1]_1, and the short-circuit switch 32_i is used for coupling between the power supply lines VDM[0]_i and VDM[1]_i. Since it is required, in principle, that each short-circuit switch should be arranged to provide mutual coupling between the output nodes of the power supply switches corresponding to column bit lines selected by different column select signals. Hence, the short-circuit switches may be so arranged as to provide coupling between the power supply lines VDM[0]_0 and VDM[1]_1, coupling between the power supply lines VDM[0]_1 and VDM[1]_i, and coupling between the power supply lines VDM[0]_i and VDM[1]_0, for example.

Although not shown in the accompanying drawings, for the other column select signals, an arrangement similar to that for the column select signals YS[0] and YS[1] should be provided in a repetitive fashion as required.

In the configuration of the power supply circuit 10 shown in FIG. 1, under a condition where the memory enable signal ME is made inactive to provide a memory-operation-unselected state, all the column select signals YS[0], YS[1], and so forth are turned to an unselected level (low level). Then, all the power switches 30_0 to 30_, 31-0 to 31_, and so forth are put in an ON state, thereby feeding all the memory cells 2 with a power supply voltage VDD. Thus, data is retained in each memory part with static latching.

When a read operation is instructed in a memory-operation-selected state provided by the activation of the memory enable signal ME, the write enable signal WE is turned to a write-operation-unindicated level (low level) to cause all the short-circuit switches 32_0 to 32_i, and so forth to be put in an ON state. Thus, even when a selected level (high level) is indicated by a column select signal corresponding to a complementary bit line subjected to column selection in the read operation and a power switch corresponding to the selected column concerned is put in an OFF state, the output node of the power switch concerned is fed with a power supply voltage VDD from a power supply line of another unselected column via a short-circuit switch in an ON state. Hence, it is ensured that all the memory cells 2 are fed with a power supply voltage VDD to retain data therein. For example, in a situation where the column select signal YS[0] is turned to a selected level (high level), a power supply voltage VDD is fed to the power supply lines VDM[0]_0 to VDM[0]_i from the power supply lines VDM[1]_0 to VDM[1]_i of adjacent unselected columns via the shirt-circuit switches 32_0 to 32_i, respectively. That is, since a power supply voltage VDD is fed to another column through assistance of a short-circuit switch, data in each memory cell is retained with higher stability.

When a write operation is instructed in a memory-operation-selected state provided by the activation of the memory enable signal ME, the write enable signal WE is turned to a write-operation-indicated level (high level) to cause all the short-circuit switches 32_0 to 32_i, and so forth to be put in an OFF state. Thus, the power supply line of a selected column is not fed with a power supply voltage VDD from a power supply line of another unselected column via a short-circuit switch. For example, in a situation where the column select signal YS[0] is turned to a selected level (high level), no power supply voltage VDD is fed to the power supply lines VDM[0]_0 to VDM[0]_i from the power supply lines VDM[1]_0 to VDM[1]_i of adjacent unselected columns via the short-circuit switches 32_0 to 32_i, respectively. Hence, no power supply voltage VDD is fed from the power supply lines to memory cells of the column selected for the write operation, causing a memory cell operating voltage to decrease down to a level provided by a parasitic capacity of power wiring or a charging potential of wiring capacity. Thus, a write margin can be enhanced in the write operation.

In the arrangement mentioned above, since each power switch for memory cells is switch-controlled with respect to each complementary bit line, it is not required to dispose a logic gate such as an AND gate. With the provision of the short-circuit switch for power supply, switching control is performed for the power switch and the short-circuit switch through use of a complementary bit line select signal and a write instruction signal that are available intrinsically, thereby reducing a power supply voltage applied to memory cells in a write operation to a level lower than that in a read operation. Thus, it is possible to enhance a write margin without degradation of a static noise margin while obviating an increase in physical circuit size.

Further, for implementation of the above arrangement, it is required, in principle, that each power switch should be disposed for each power supply line corresponding to a complementary bit line selected by a complementary bit line select signal for use in common at least, and that each short-circuit switch should be arranged to provide coupling between an output node of each power switch and an output node of at least one of the other power switches in such a fashion that the output nodes of the power switches to be coupled mutually correspond to complementary bit lines selected by different complementary bit line select signals at least. Thus, it is possible to reduce the number of power switches and the number of short-circuit switches to a required minimum. For example, there is no need to provide coupling between the power supply lines VDM[1]_0 to VDM[1]_i shown in FIG. 1 and power supply lines VDM[2]_0 to VDM[2]_i not shown via short-circuit switches, respectively. Since each power switch is put in an OFF state with respect to one column selected by a column select signal for use in common, the data retaining function of each memory cell can be ensured on the condition that a power supply line of one column is coupled to that of another column.

<3. Exemplary Basic Arrangement of Power Supply Circuit>

Figure 4:
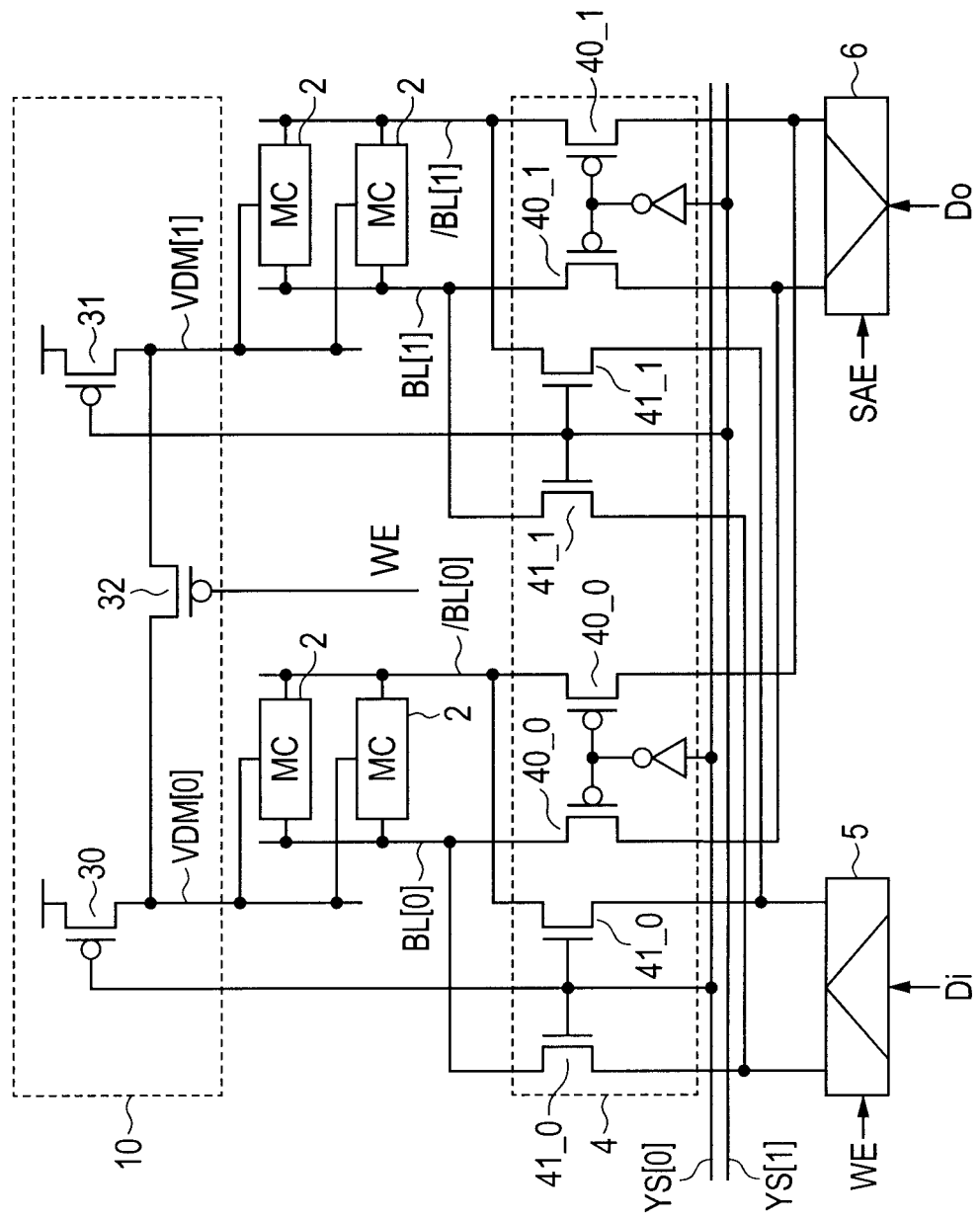
FIG. 4 is a block diagram illustrating basic configurations of a power supply circuit and a column select switch circuit in a case where columns /BL[0], BL[0] and /BL[1], BL[1] are selected by column select signals YS[0] and YS[1], respectively.
Figure 5:
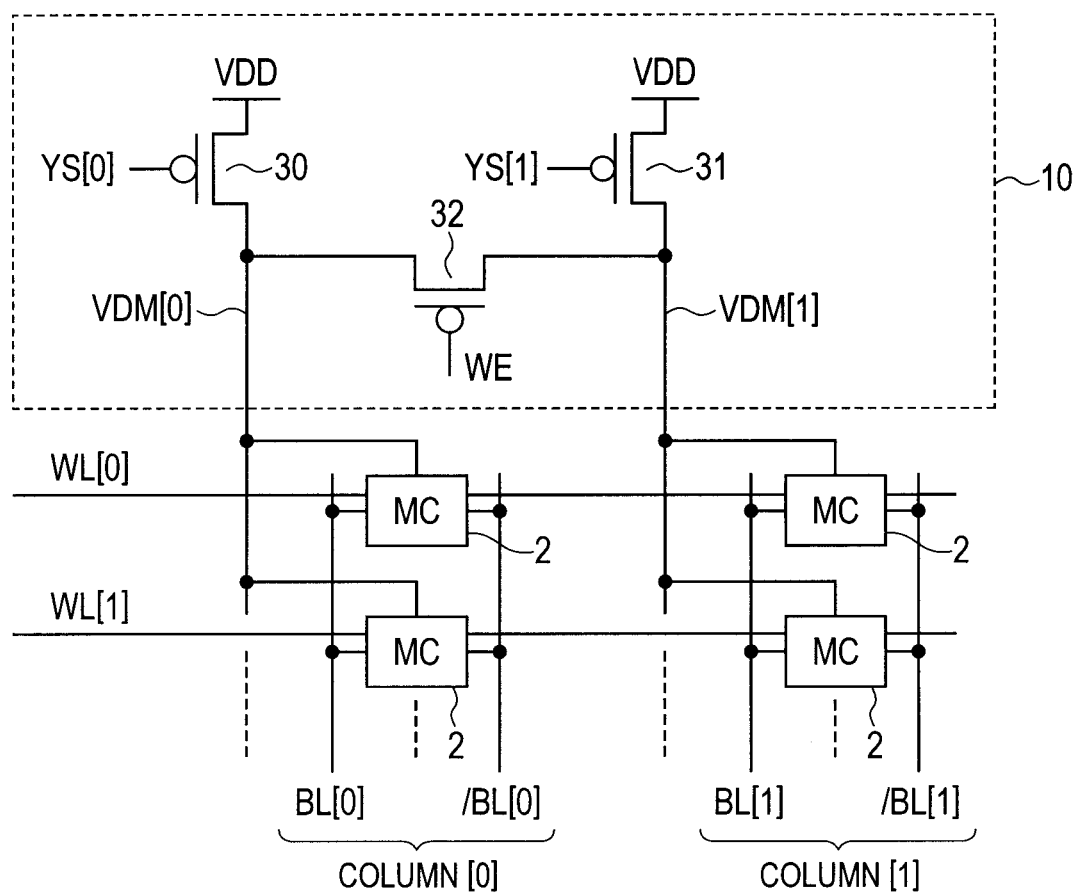
FIG. 5 is a circuit diagram showing a part extracted from FIG. 4.

Referring to FIGS. 4 and 5, there are shown exemplary basic configurations of the power supply circuit 10 and the column select switch circuit 4 in a case where columns /BL[0], BL[0] and /BL[1], BL[1] are selected by the column select signals YS[0] and YS[1], respectively. FIG. 5 shows a partial circuit extracted from FIG. 4.

The column select switch circuit 4 comprises n-channel switch MOS transistors 41_0 to 41_1 corresponding to the complementary bit lines /BL[0], BL[0] and /BL[1], BL[1], and p-channel switch MOS transistors 400 to 40_1 corresponding to the complementary bit lines /BL[0], BL[0] and /BL[1], BL[1]. The n-channel switch MOS transistors 41_0 to 41_1 are arranged as write switches coupled to the write driver 5. The p-channel switch MOS transistors 40_0 to 40_1 are arranged as read switches coupled to the sense amplifier 6.

Figure 6:
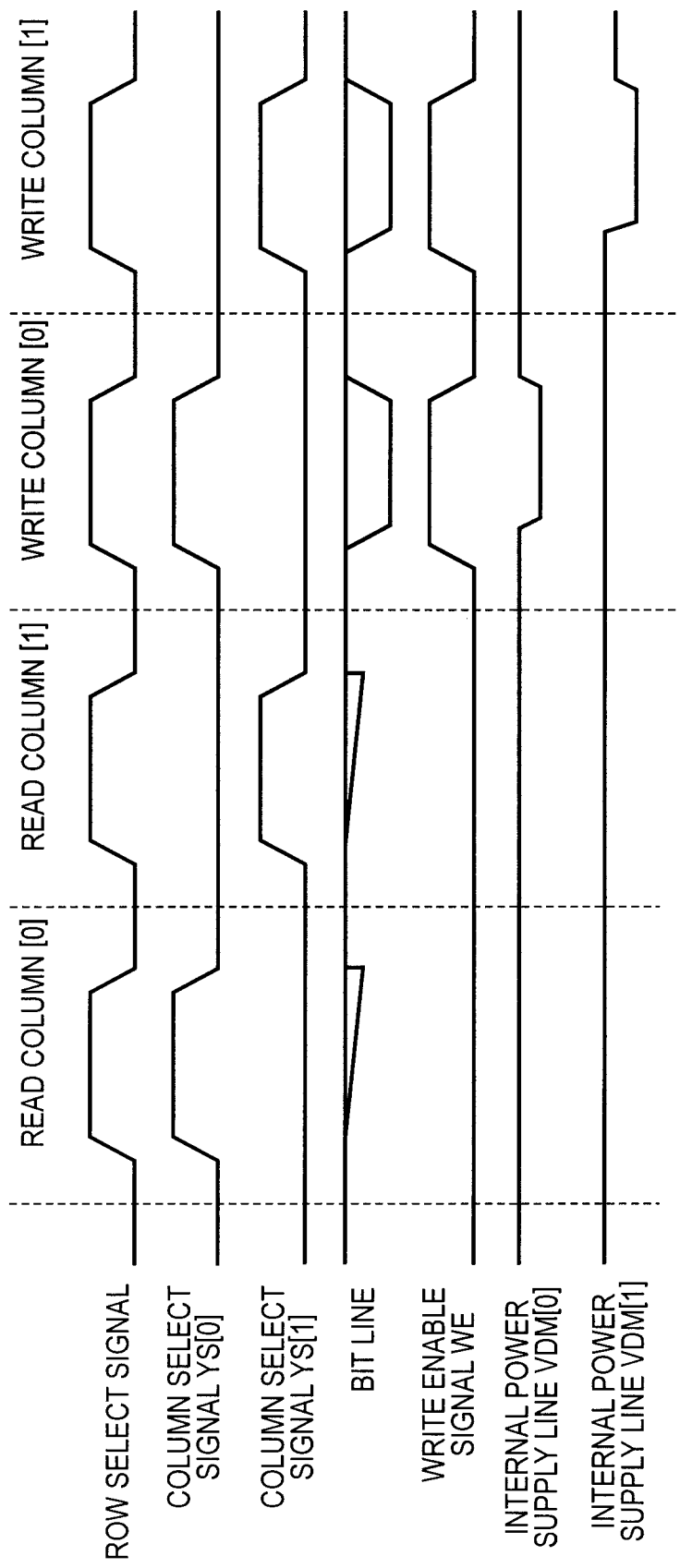
FIG. 6 is a timing chart illustrating signal waveforms of write and read operations.

Referring to FIG. 6, there is shown an exemplary timing chart of signal waveforms of write and read operations. As illustrated in FIG. 5, column [0] indicates the complementary bit line pair /BL[0], BL[0], and column [1] indicates the complementary bit line pair /BL[1], BL[1].

In a read operation, the short-circuit switch 32 is in an ON state regardless whether the column [0] or the column [1] is subjected to reading-out. Hence, a power supply voltage VDD is fed to both the internal power supply lines VDM[0] and VDM[1], i.e., each memory cell 2 is fed with a necessary power supply voltage for reading-out. Thus, there occurs no degradation in a static noise margin.

In a write operation, the short-circuit switch 32 is turned to an OFF state. Hence, in a situation where the column [0] is subjected to writing-in, a power supply voltage VDD is shut off from the power supply line VDM[0] corresponding to the column [0], causing a voltage applied to the power supply line VDM[0] to decrease down to a certain level. Thus, a write margin can be enhanced with respect to each memory cell 2 of the column [0]. Likewise, in a situation where the column [1] is subjected to writing-in, a power supply voltage VDD is shut off from the power supply line VDM[1] corresponding to the column [1], causing a voltage applied to the power supply line VDM[1] to decrease down to a certain level. Thus, a write margin can be enhanced with respect to each memory cell 2 of the column [1].

Advantageous effects similar to those described with reference to FIG. 1 can also be provided in the arrangement shown in FIGS. 4 and 5.

<4. Reliable Retention Characteristic>

Figure 7:
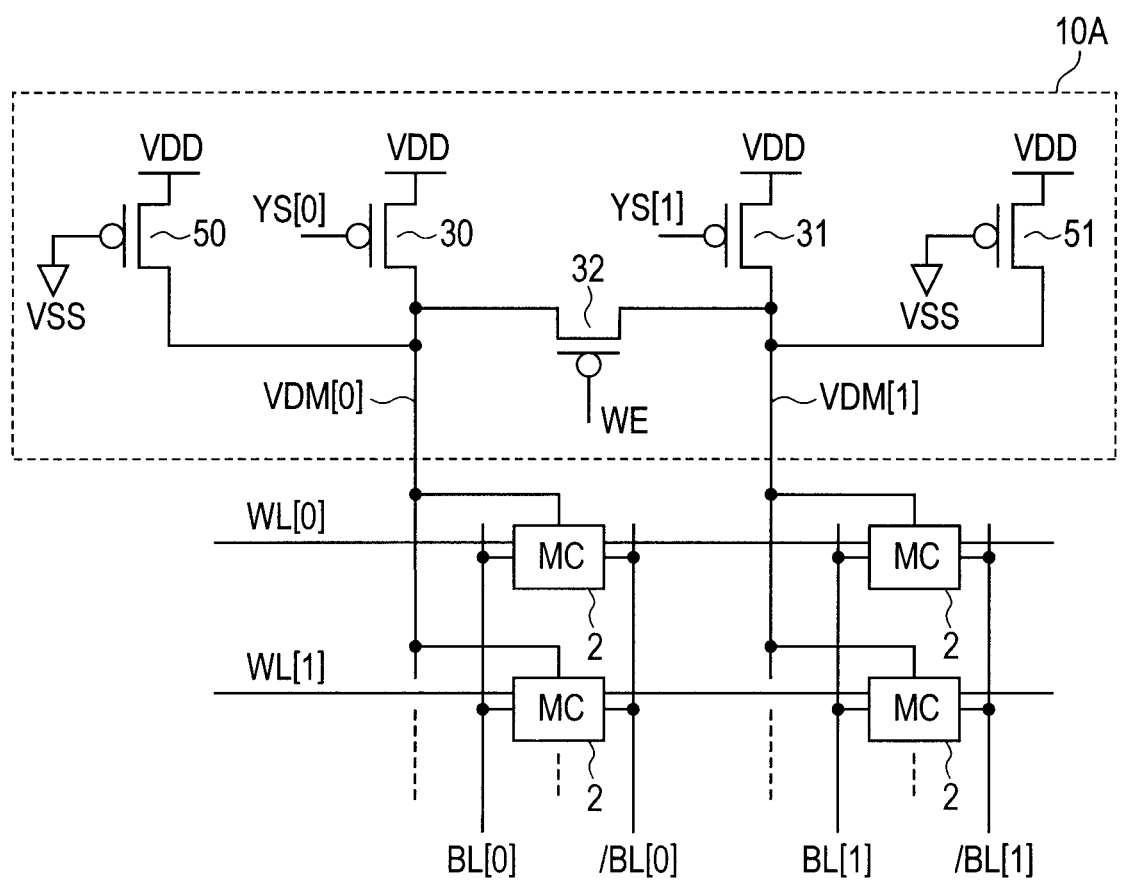
FIG. 7 is a circuit diagram illustrating a configuration for ensuring a retention characteristic of data stored in memory cells of a write-selected column.

Referring to FIG. 7, there is shown an exemplary configuration for ensuring a retention characteristic of data (information) stored in memory cells of a write-selected column. The configuration shown in FIG. 7 is based on that shown in FIG. 5. In a power supply circuit 10A, retention switches 50 and 51 formed by using p-channel MOS transistors are disposed additionally in parallel with the power switches 30 and 31. Each of the retention switches 50 and 51 provides a mutual conductance smaller than that of each of the power switches 30 and 31 disposed in parallel therewith. With the power switches 30 and 31 in an OFF state (OFF state) at least, a retention current for data stored in memory cells is fed to the power supply lines VDM[0] and VDM[1]. In the example shown in FIG. 7, a ground voltage VSS is applied to the gate of each of the retention switches 50 and 51 at all times.

In the above configuration wherein the retention switches 50 and 51 are disposed additionally, with the power switches 30 and 31 in an OFF state, a certain degree of power feeding to each memory cell 2 is allowed. Thus, even if a write operation time is prolonged, it can be ensued that write-unselected memory cells in a write-selected column do not become incapable of retaining data therein.

Figure 8:
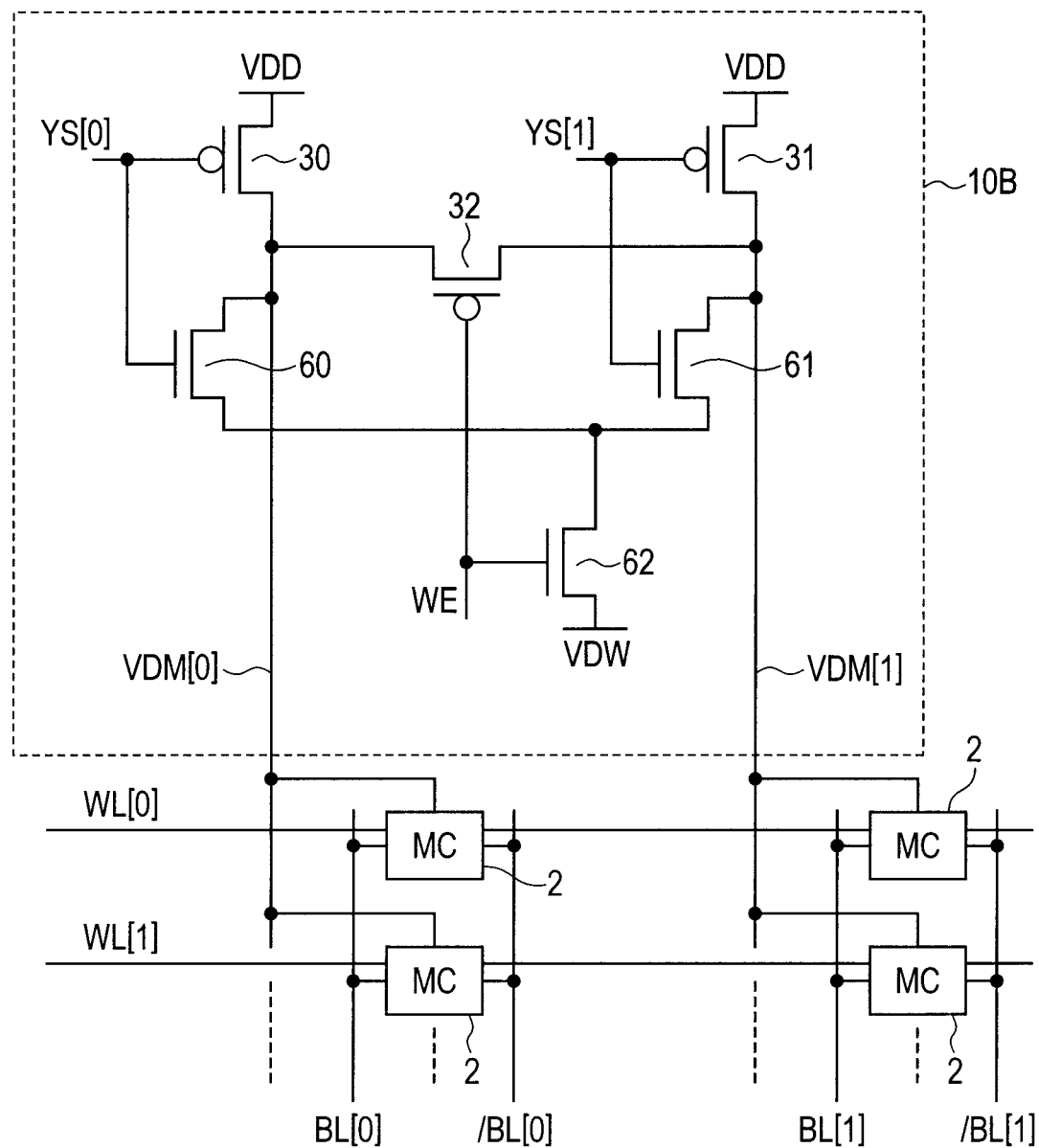
FIG. 8 is a circuit diagram illustrating another configuration for ensuring a retention characteristic of data stored in memory cells of a write-selected column.

Referring to FIG. 8, there is shown another exemplary configuration for ensuring a retention characteristic of data (information) stored in memory cells of a write-selected column.

The configuration shown in FIG. 8 is also based on that shown in FIG. 5. In a power supply circuit 10B, two n-channel first switch MOS transistors 60 and 61, and an n-channel second switch MOS transistor 62 are provided additionally. The n-channel first switch MOS transistors 60 and 61 are disposed in parallel with the power supply lines VDM[0] and VDM[1] so as to perform complementary switching operation with respect to the corresponding power switches 30 and 31. The n-channel second switch MOS transistor 62 is disposed between an internal voltage VDW and a source electrode common to the first switch MOS transistors 60 and 61 so as to perform complementary switching operation with respect to the corresponding short-circuit switch 32. In a write-selected column with the power switches 30 and 31 in an OFF state, the first switch MOS transistors 60 and 61 and the second switch MOS transistor 62 are used to feed the corresponding power supply lines VDM[0] and VDM[1] with the internal voltage VDW, which serves as a retention voltage for data stored in each memory cell 2. The internal voltage VDW has a potential level lower than that of the power supply voltage VDD.

In the above arrangement wherein the first and second switch MOS transistors 60, 61, and 62 are provided as retention switches, with the power switches 30 and 31 in an OFF state, a certain degree of power feeding to each memory cell 2 is allowed. Thus, even if a write operation time is prolonged, it can be ensured that write-unselected memory cells in a write-selected column do not become incapable of retaining data therein.

Figure 9:
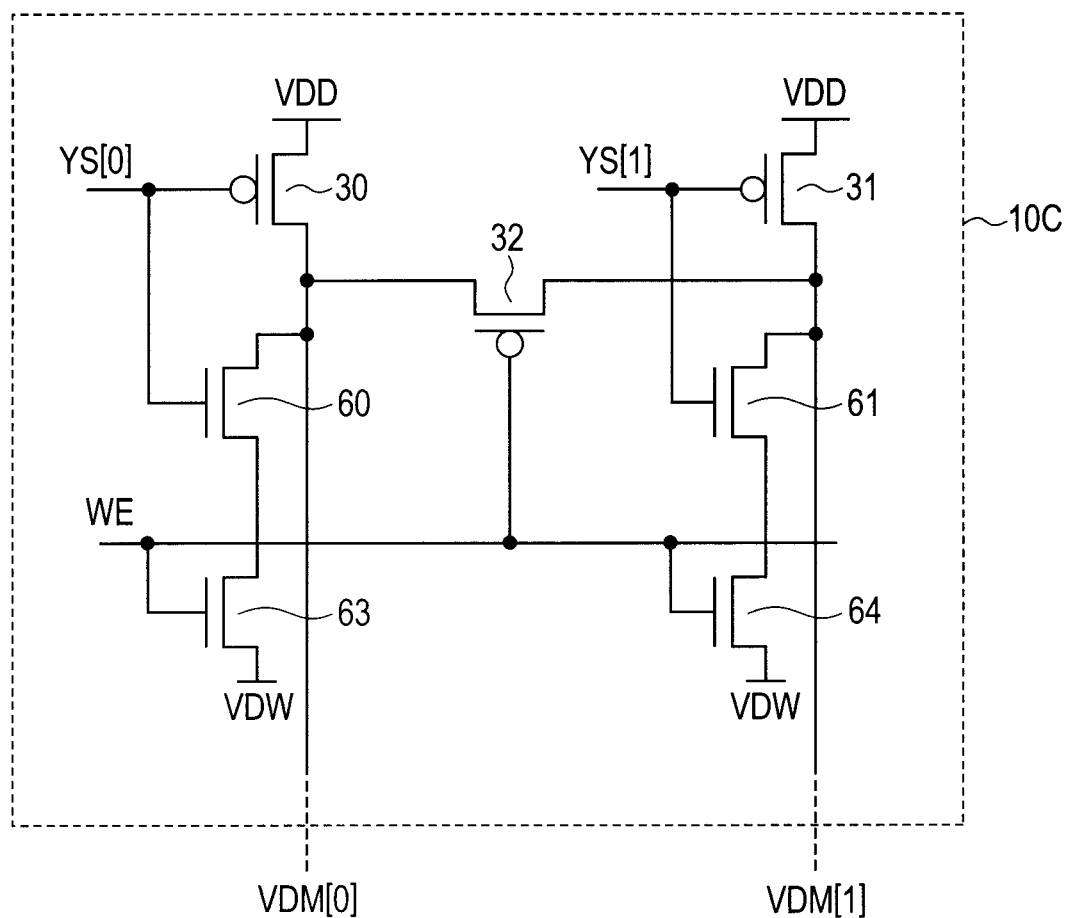
FIG. 9 is a circuit diagram illustrating still another configuration for ensuring a retention characteristic of data stored in memory cells of a write-selected column.

Referring FIG. 9, there is shown still another exemplary configuration for ensuring a retention characteristic of data stored in memory cells of a write-selected column. Differently from the configuration shown in FIG. 8, two n-channel switch MOS transistors 63 and 64 are disposed in lieu of the second switch MOS transistor 62. These n-channel switch MOS transistors 63 and 64 are coupled in series with the first switch MOS transistors 60 and 61, respectively.

In the configuration shown in FIG. 9, the number of MOS transistors used for data retention is increased.

Referring to FIGS. 10 to 13, there are presented modified exemplary configurations for data retention in relation to the configurations shown in FIGS. 8 and 9.

Figure 10:
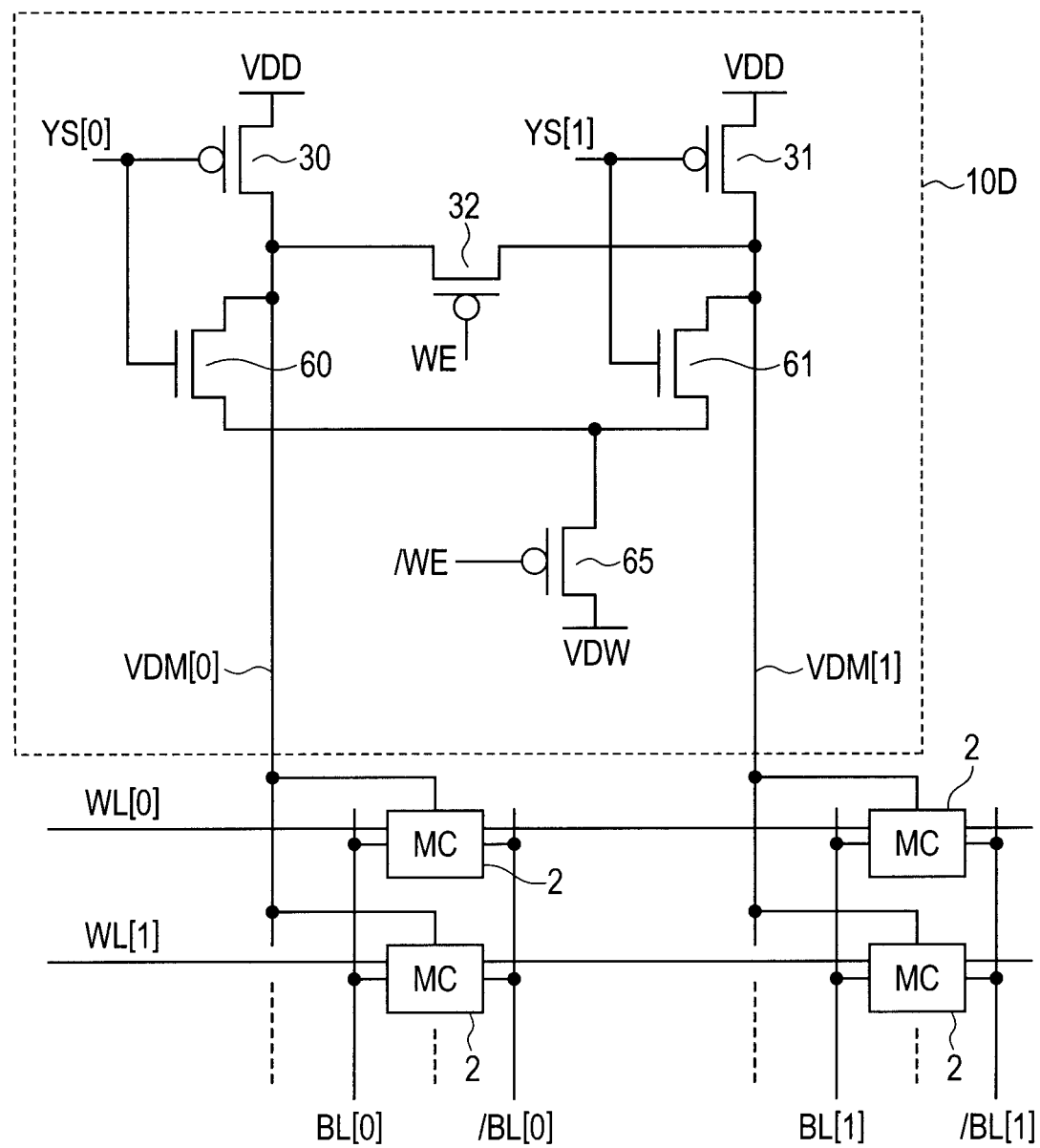
FIG. 10 is a circuit diagram showing a modified example of the configuration for data retention illustrated in FIG. 8.

In a power supply circuit 10D exemplified in FIG. 10, a p-channel MOS transistor 65 is disposed in lieu of the n-channel MOS transistor 62 shown in FIG. 8 so as to perform switching control by using an inverted signal /WE of the write enable signal WE.

In a power supply circuit 10E exemplified in FIG, p-channel MOS transistors 66 and 67 are disposed in lieu of the n-channel MOS transistors 63 and 64 shown in FIG. 9 so as to perform switching control by using the inverted signal /WE of the write enable signal WE.

Figure 12:
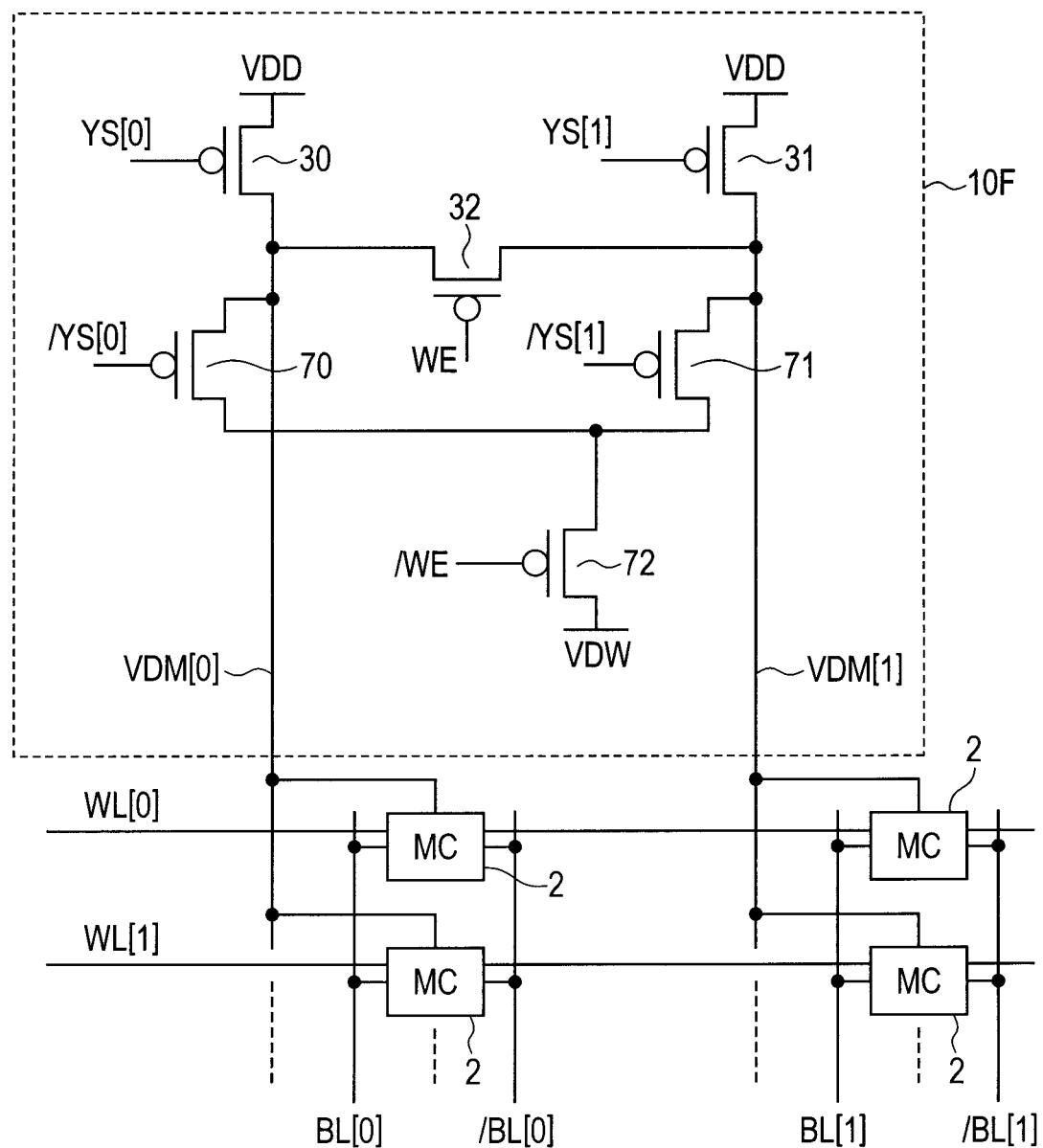
FIG. 12 a circuit diagram showing another modified example of the configuration for data retention illustrated in FIG. 8.

In a power supply circuit 10F exemplified in FIG. 12, p-channel MOS transistors 70 and 71 are disposed in lieu of the n-channel MOS transistors 60 and 61 shown in FIG. 10 so as to perform switching control by using inverted signals /YS[0] and /YS[1] of the column select signals YS[0] and YS[1].

Figure 11:
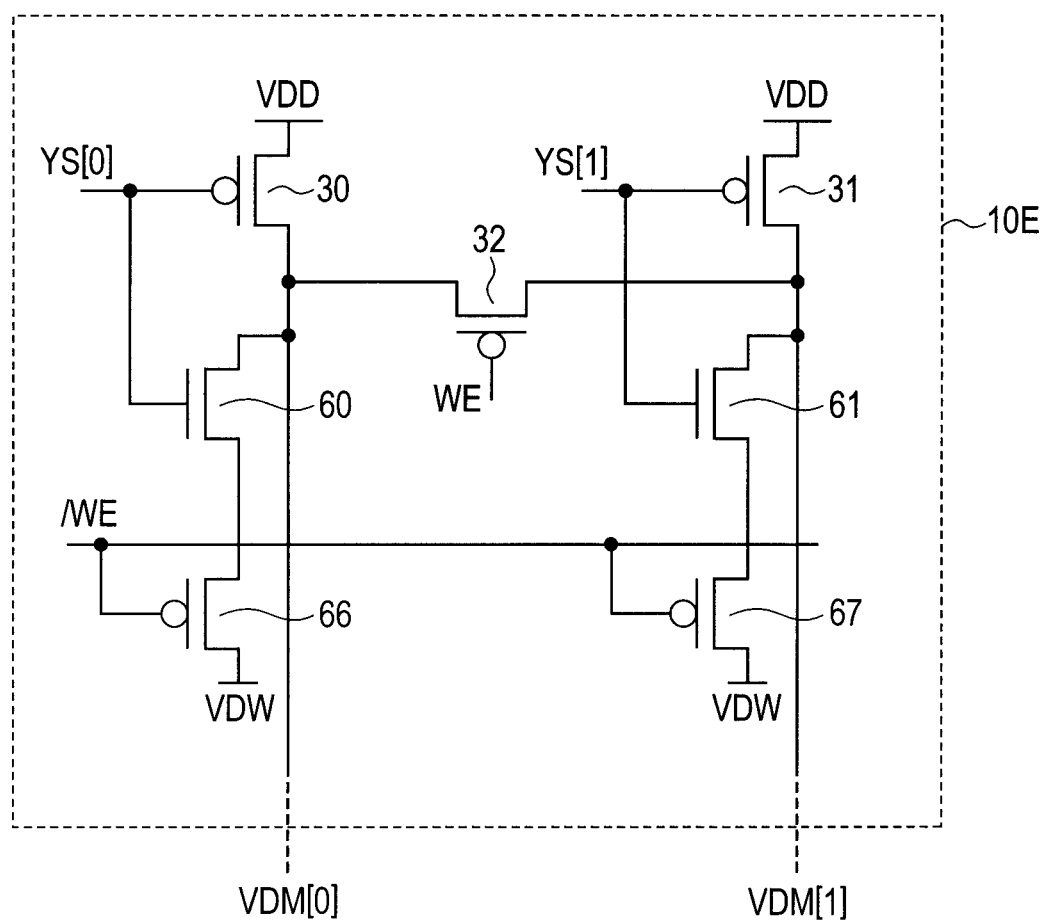
FIG. 11 is a circuit diagram showing a modified example of the configuration for data retention illustrated in FIG. 9.
Figure 13:
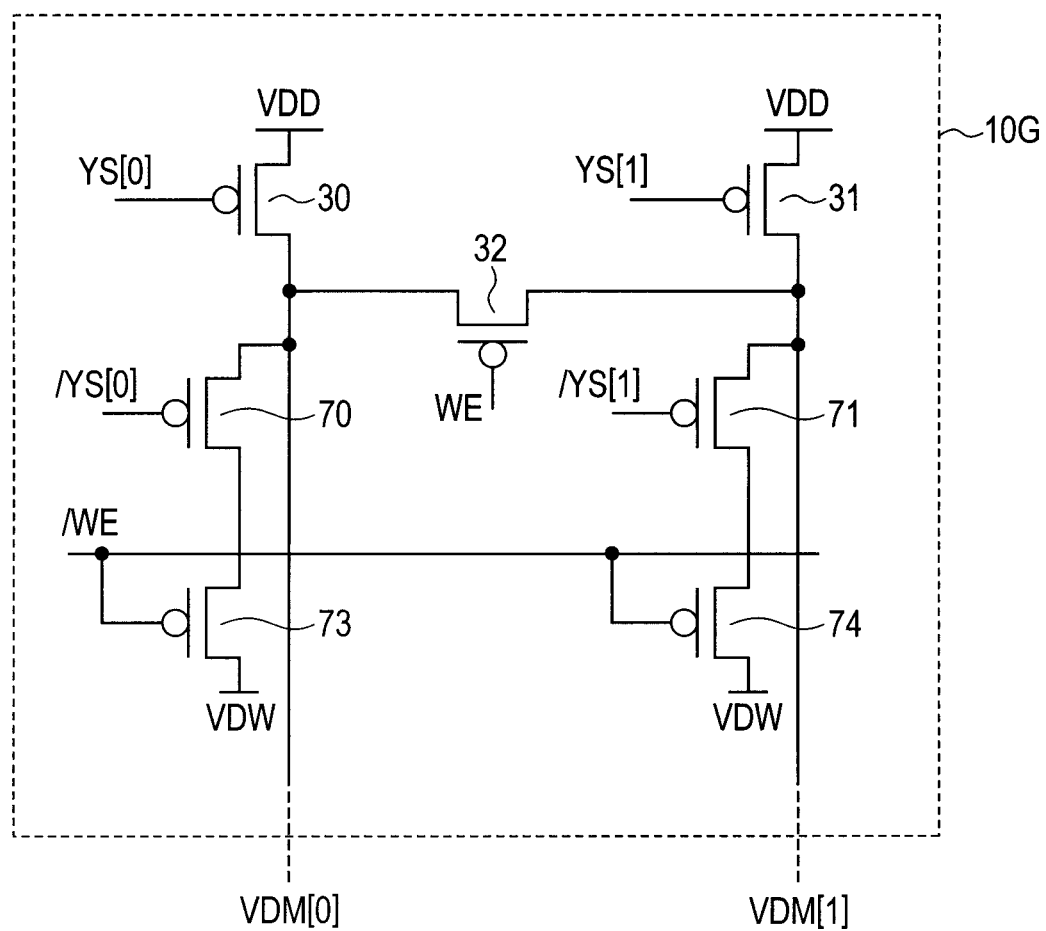
FIG. 13 a circuit diagram showing another modified example of the configuration for data retention illustrated in FIG. 9.

In a power supply circuit 10G exemplified in FIG. 13, p-channel MOS transistors 70 and 71 are disposed in lieu of the n-type MOS transistors 60 and 61 shown in FIG. 11 so as to perform switching control by using the inverted signal /YS[0] and /YS[1] of the column select signals YS[0] and YS[1].

<5. Provision of Redundant Short-Circuit Switches>

Figure 14:
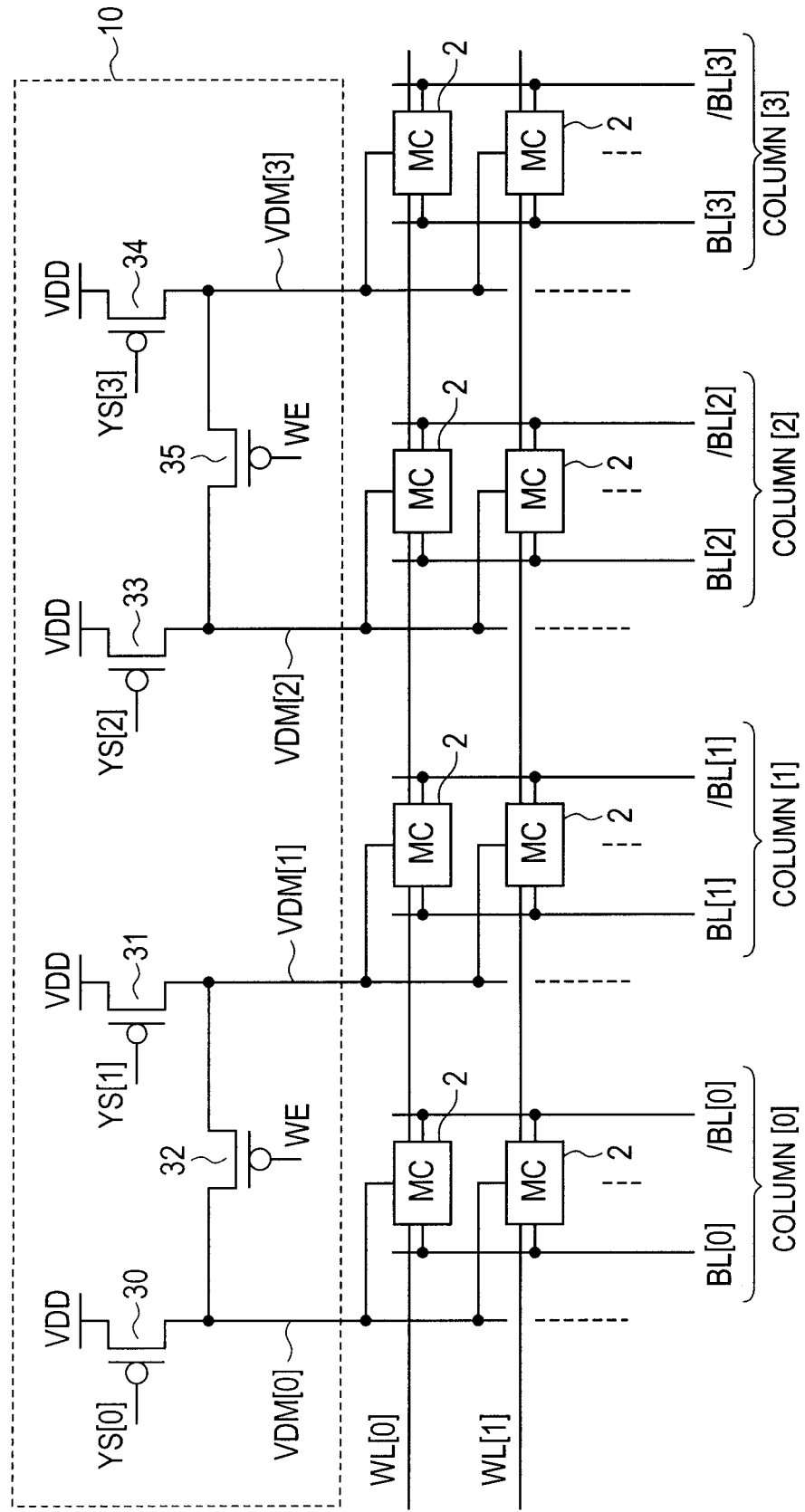
FIG. 14 is a circuit diagram showing the power supply circuit configuration illustrated in FIG. 5 with respect to columns [0] to [3]

Referring to FIG. 14, a circuit diagram corresponding to the configuration of the power supply circuit 10 in FIG. 5 is shown with respect to columns [0] to [3]. Reference numeral 33 indicates a power switch of the column [2], reference numeral 34 indicates a power switch of the column [3], and reference numeral 35 indicates a short-circuit switch for selectively providing short-circuiting between power supply lines VDM[2] and VDM[3]. Since each power switch is put in an OFF state with respect to one column selected by a column select signal for use in common as described with reference to FIG. 1, the data retaining function of each memory cell can be ensured on the condition that a power supply line of one column is coupled to that of another column. Hence, in terms of functionality, it is not essential to dispose a short-circuit switch between the power supply lines VDM[1] and VDM[2].

Referring to FIG. 14, there is shown an exemplary coupling arrangement wherein a short-circuit switch 36 not essential in terms of functionality is disposed between the power supply lines VDM[1] and VDM[2] in the configuration shown in FIG. 14. This redundant short-circuit switch 36 has no effect on the data retaining function of each memory cell with respect to power supply voltage feeding to the memory cell. However, the redundant short-circuit switch 36 may serve to ensure continuity or uniformity in transistor disposition associated with a layout of the short-circuit switches. That is, in the memory cell array 11 having regularity in layout patterning, it is possible to increase the degree of regularity with respect to repetitive formations of short-circuit switches, thus contributing to a reduction in the number of points to be subjected to distortion that is likely to occur at edges of a repetitive pattern.

Figure 16:
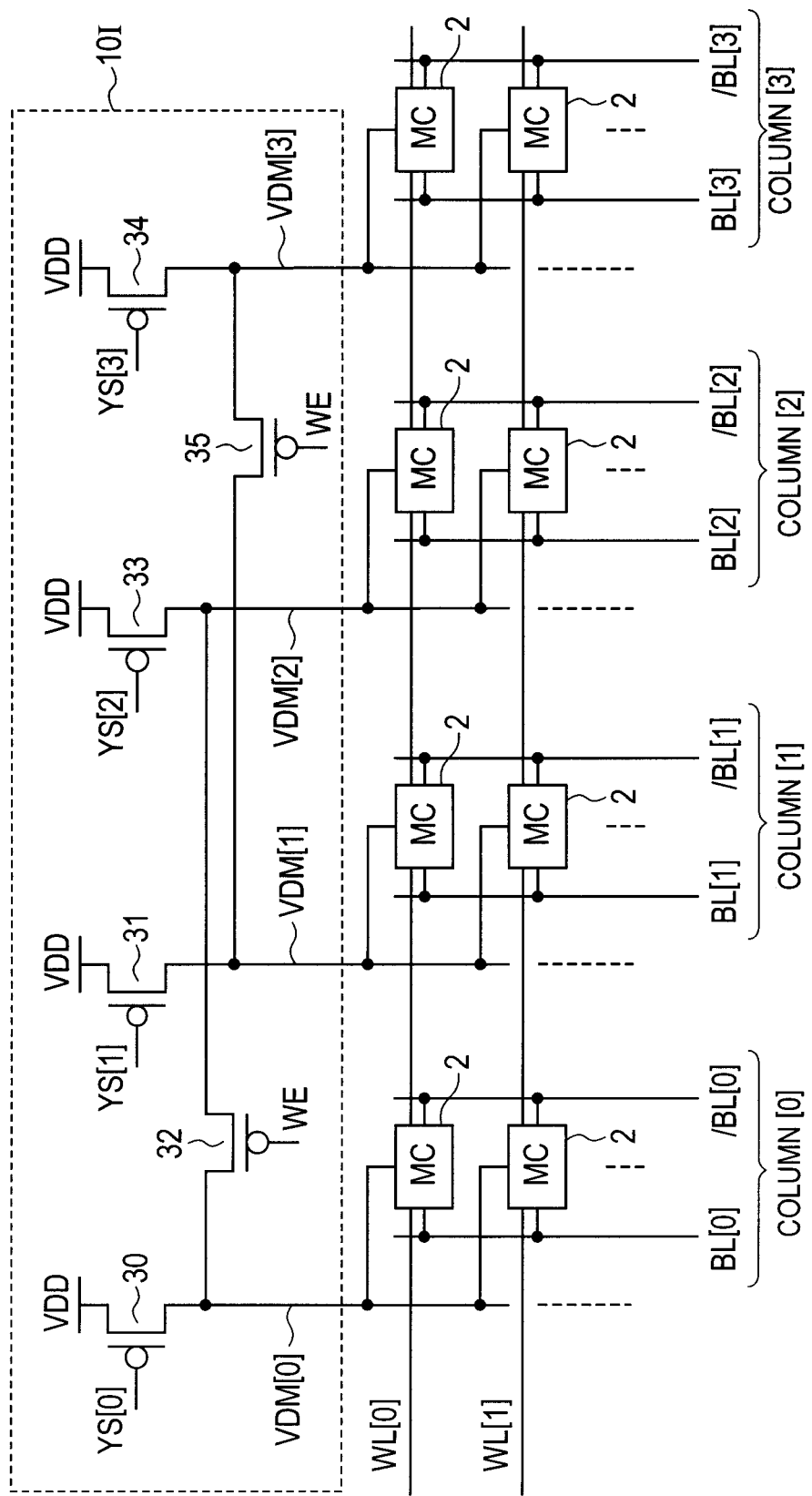
FIG. 16 is a circuit diagram showing another exemplary coupling arrangement of a short-circuit switch.
Figure 17:
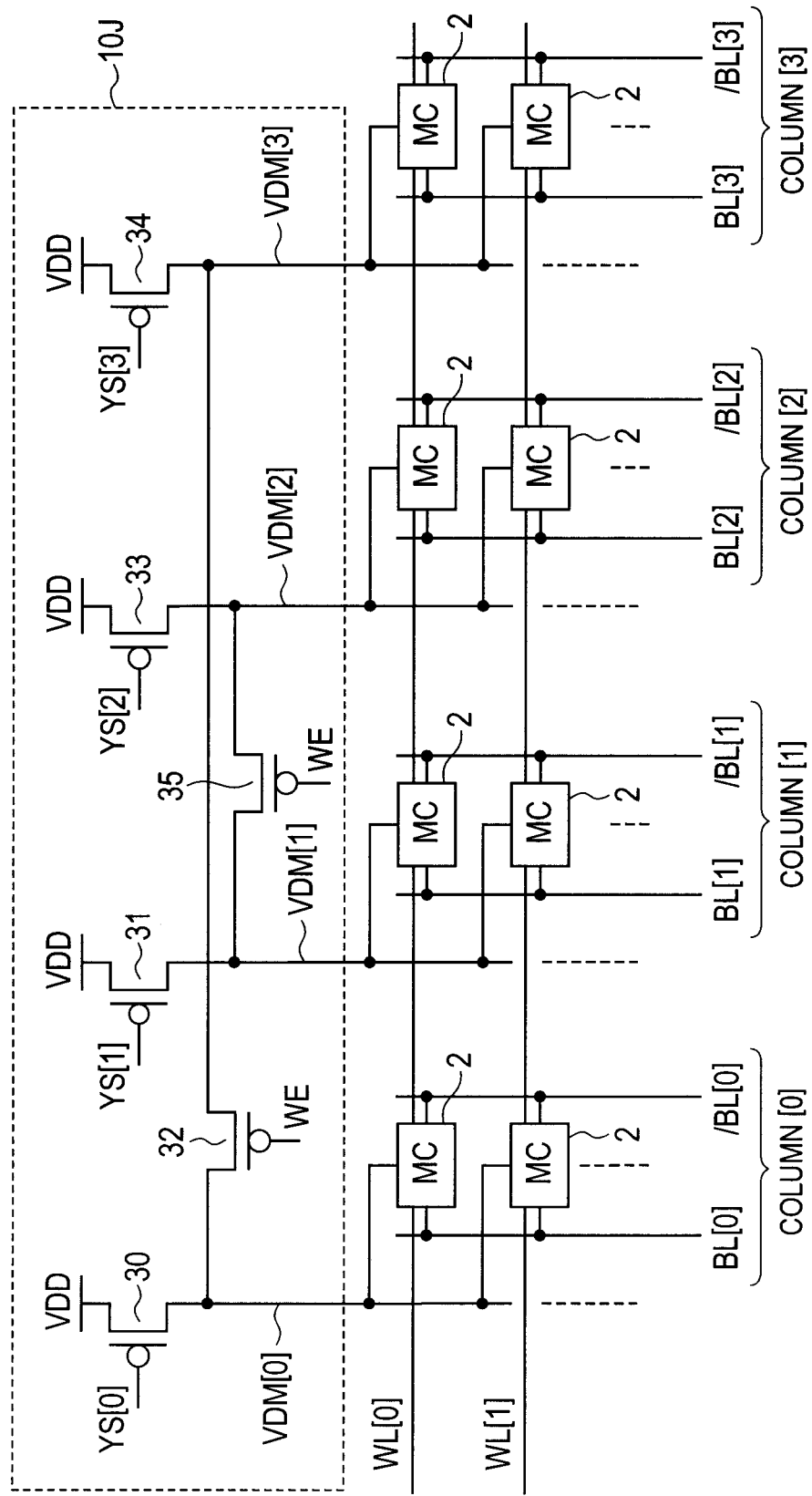
FIG. 17 is a circuit diagram showing still another exemplary coupling arrangement of a short-circuit switch.

In semiconductor integrated circuit fabrication processes, it is desirable to ensure uniformity in repetitive patterning even by repeatedly disposing redundant short-circuit switches 36 as mentioned above. However, in some cases, the repetitive formations of redundant short-circuit switches may not be applicable due to constraints in layout pattern design, and further, in other cases, it may not be allowed to provide coupling between adjacent power supply lines as in FIG. 14. Even in these cases, since each power switch is put in an OFF state with respect to one column selected by a column select signal for use in common as described in the foregoing, the data retaining function of each memory cell can be ensured on the condition that a power supply line of one column is coupled to that of another column. That is, in arrangements wherein power supply lines are mutually coupled as illustrated in FIGS. 16 and 17, there occurs no problem regarding the data retaining function of each memory cell. In the arrangement shown in FIG. 16, the power supply line VDM[0] is coupled to the power supply line VDM[2] via a short-circuit switch 32, and the power supply line VDM[1] is coupled to the power supply line VDM[3] via a short-circuit switch 35. In the arrangement shown in FIG. 17, the power supply line VDM[0] is coupled to the power supply line VDM[3] via a short-circuit switch 32, and the power supply line VDM[1] is coupled to the power supply line VDM[2] via a short-circuit switch 35.

Figure 15:
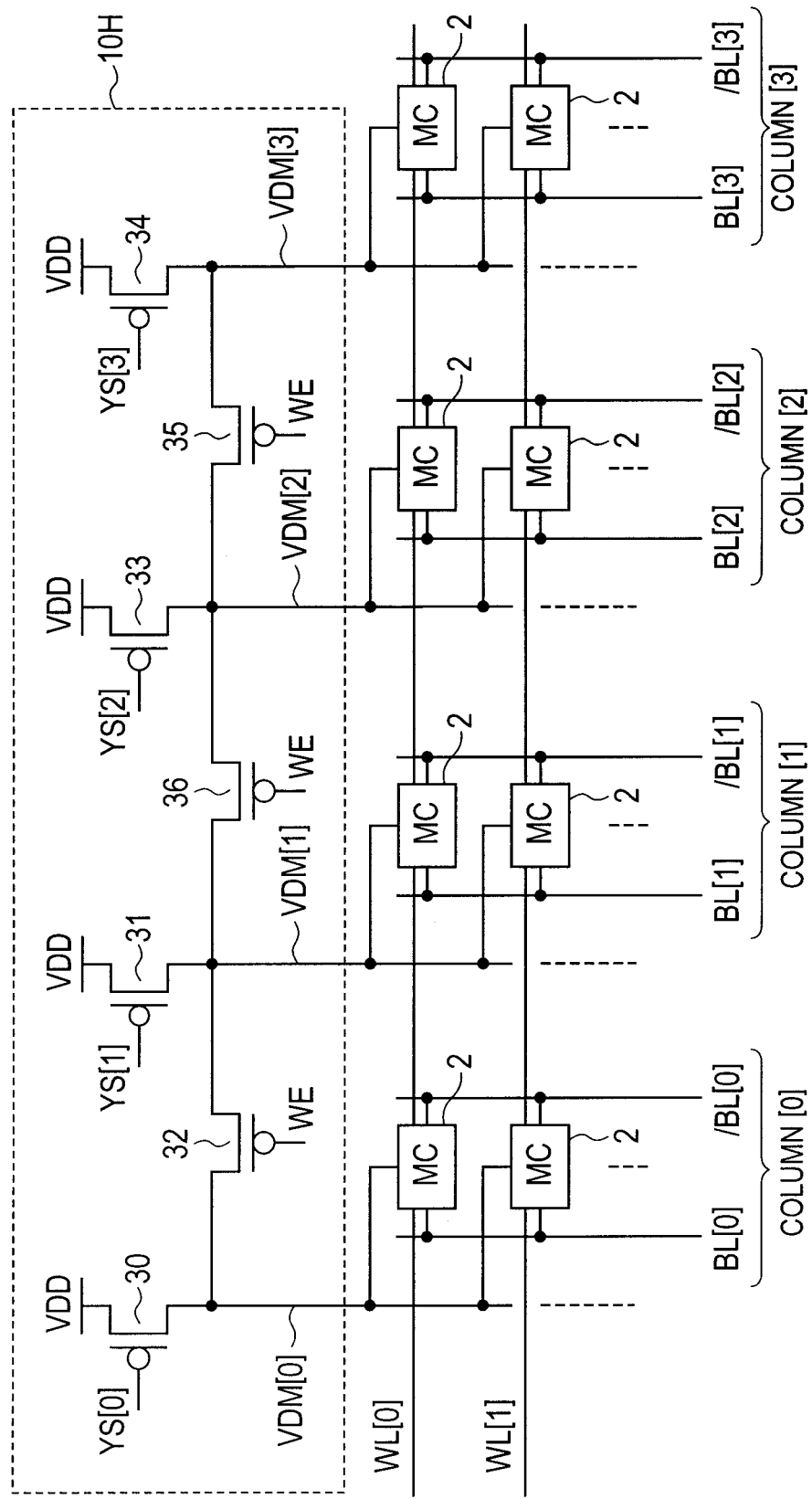
FIG. 15 is a circuit diagram showing an exemplary coupling arrangement wherein a short-circuit switch not essential in terms of functionality is disposed between power supply lines VDM[1] and VDM[2] in the configuration illustrated in FIG. 14.
Figure 18:
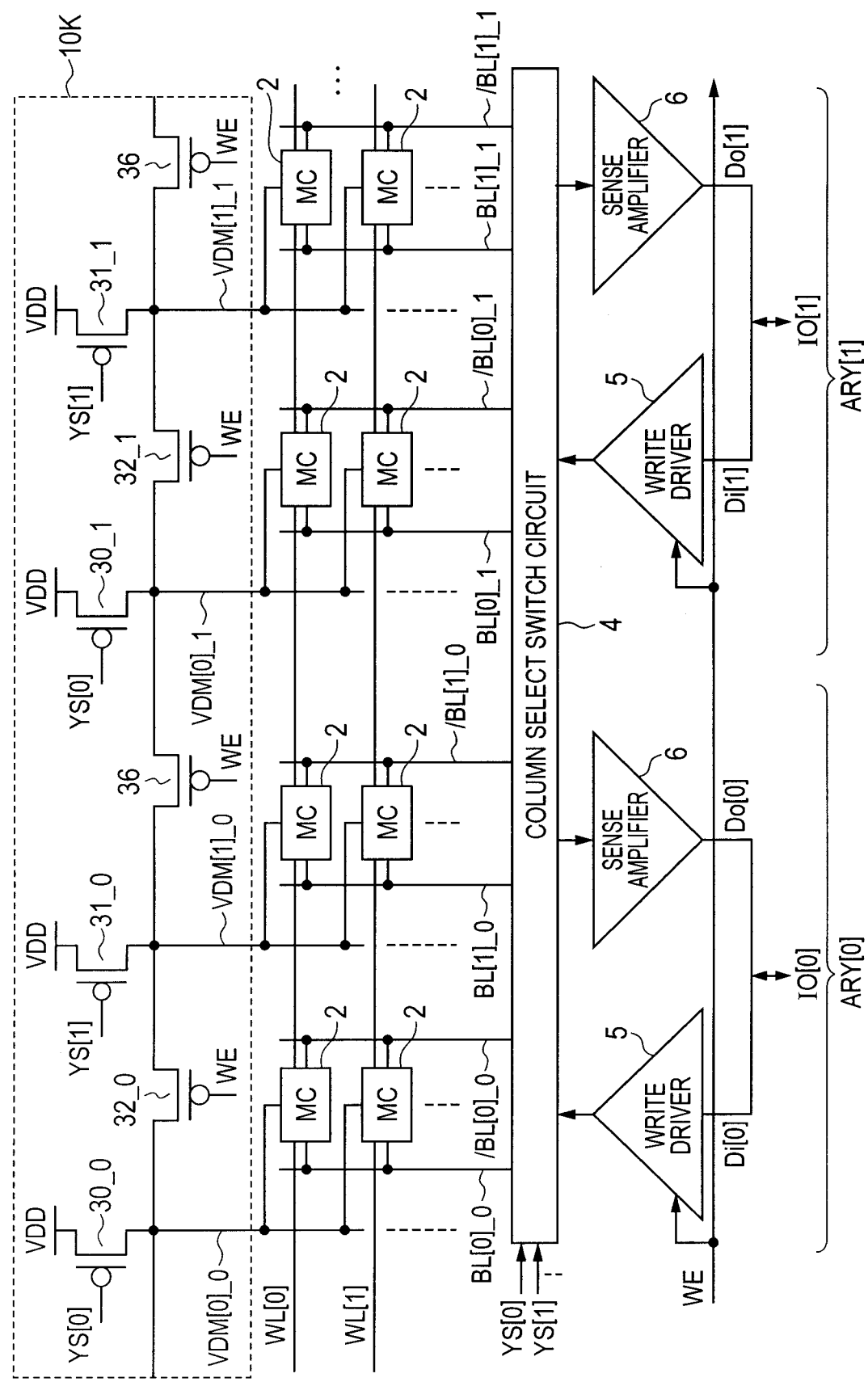
FIG. 18 is a circuit diagram illustrating a configuration of a power supply circuit for a plural-bit parallel data input/output scheme corresponding to FIG. 1.

Referring to FIG. 18, there is shown a power supply circuit 10K for a plural-bit parallel data input/output scheme corresponding to FIG. 1. Although illustrated differently from FIG. 1, the circuit configuration shown in FIG. 18 is substantially the same as that in FIG. 1. In FIG. 18, it is indicated in particular that redundant short-circuit switches 36 may be disposed even in the case of plural-bit parallel data input/output. In this case also, the usability of the redundant short-circuit switch 36 is the same as that described with reference to FIG. 15. For the sake of simplicity, no duplicative description thereof is given here. In FIG. 18, reference code ARY[0] indicates a memory cell array area used for storing one-bit data IO[0] contained in parallel input/output data, and reference code ARY[1] indicates a memory cell array area used for storing one-bit data IO[1] contained therein.

<6. Arrangement for Bitwise Write Operation>

Figure 19:
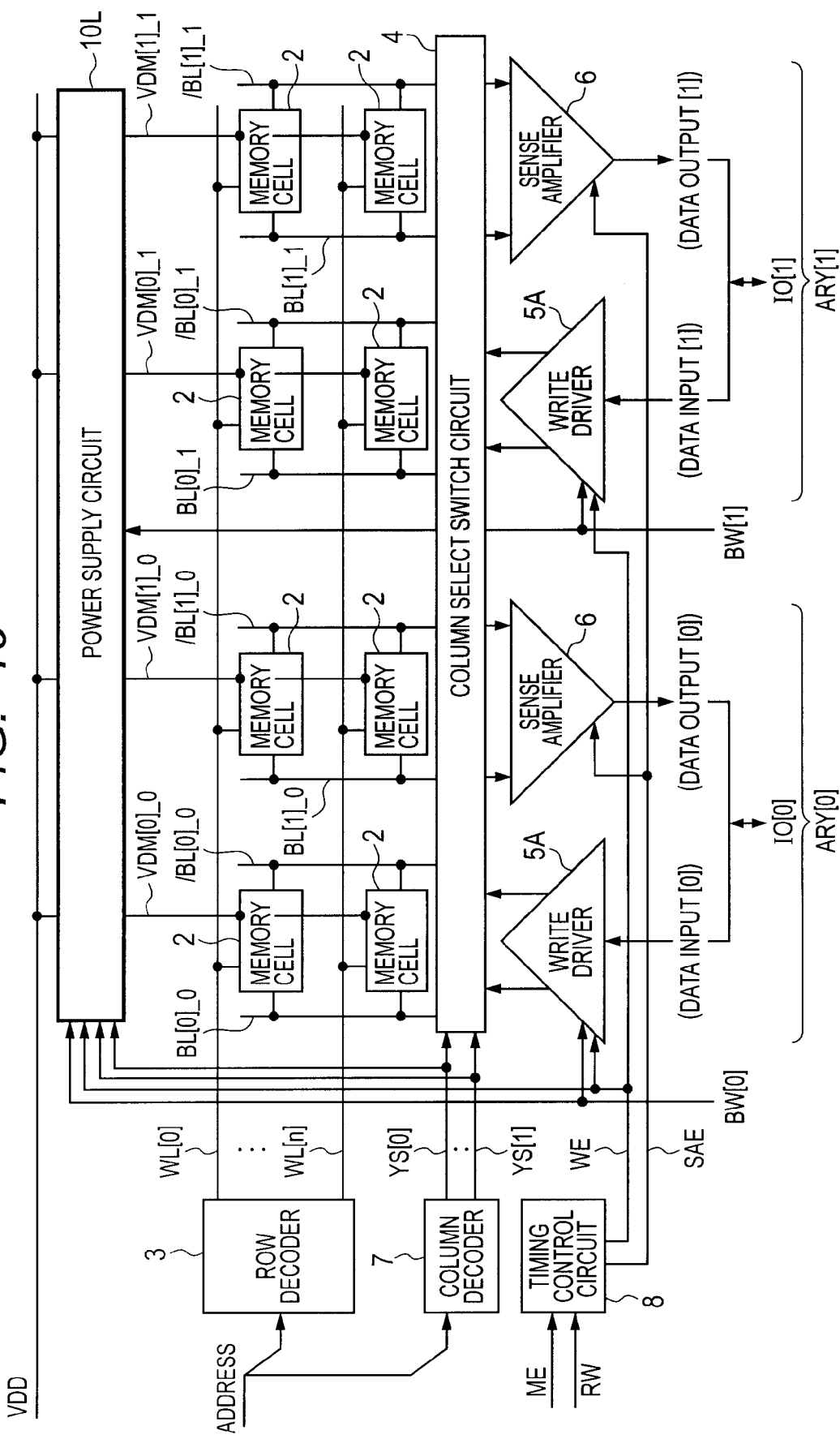
FIG. 19 is a block diagram illustrating an SRAM configuration for write margin enhancement in a case where a bitwise write operation is enabled for desired data bits contained in parallel data.

Referring to FIG. 19, there is shown an exemplary SRAM configuration for write margin enhancement in a case where a bitwise write operation is enabled for desired data bits contained in parallel data.

In FIG. 19, a memory cell array area ARY[0] for input/output data bits IO[0] and a memory cell array area ARY[1] for input/output data bits IO[1] are illustrated as representative memory areas. In each of the memory cell array areas ARY[0] and ARY[1], two selectable columns are indicated representatively. For example, as columns selectable by the column select signals YS[0] and YS[1], there are indicated a bit column corresponding to complementary bit lines /BL[0]_0, BL[0]_0, and a bit column corresponding to complementary bit lines /BL[1]_0, BL[1]_0 in the memory cell array area ARY[0].

Reference code BW[0] denotes a write mask bit for an input/output data bit IO[0], and reference code BW[1] denotes a write mask bit for an input/output data bit IO[1]. When each of the write mask bits BW[0] and BW[1] has a low level, the input/output data bit concerned is write-inhibited. When each of the write mask bits BW[0] and BW[1] has a high level, the input/output data bit concerned is write-enabled. The write mask bits BW[0] and BW[1] may be preset in a write mask register included in the SRAM configuration. Alternatively, the write mask bits BW[0] and BW[1] may be specified along with write data or at a time immediately before/after input thereof.

Each of the write mask bits BW[0] and BW[1] is fed to a corresponding write driver 5A and a power supply circuit 10L. When the write mask bit input to the write driver 5A indicates a write mask level, the write drive 5A does not perform a write signal issuance to a corresponding complementary bit line regardless of whether a write operation is indicated by the write enable signal WE.

When the write enable signal WE indicates a write operation to the power supply circuit 10L, a power shut-off condition established by turning off a short-circuit switch as described in the foregoing is canceled for a column specified by the mask bit to provide write masking thereon. Thus, a power supply voltage is fed to memory cells corresponding to the write mask bit for write-inhibition, so that data retention is not affected in these memory cells.

Referring to FIG. 20, there is shown an exemplary configuration of the power supply circuit 10L wherein a power shut-off condition established by turning off a short-circuit switch is canceled for a column specified by a mask bit to provide write masking thereon.

The power supply circuit 10L, similarly to the circuit arrangements described in the foregoing, comprises a plurality of short-circuit switches (first short-circuit switches) 32_0 and 32_1, each being formed by a p-channel MOS transistor for receiving the write enable signal WE. Further, the power supply circuit 10L includes a plurality of second short-circuit switches 38_0 and 38_1 disposed in parallel with the first short-circuit switches 32_0 and 32_1. Each of the second short-circuit switches 38_0 and 38_1 is put in an ON state in response to a write masking instruction or in an OFF state in response to a write unmasking instruction according to each of the write mask bits BW[0] and BW[1]. By using a p-channel MOS transistor, each of the second short-circuit switches 38_0 and 38_1 is formed in such a fashion that each gate thereof is fed with each of the write mask bits BW[0] and BW[1].

Thus, in a bitwise write operation using a write mask signal, i.e., in a write operation on each bit in a register region, a write margin can be enhanced with respect to each write object bit while ensuring retention of data corresponding to bits not subjected to writing-in as in the cases described in the foregoing.

<7. Data Processor>

Each of the SRAM configurations described hereinabove is implementable in the form of a single SRAM chip in practical applications. Further, it is preferable to use the above-described SRAM configuration in the formation of each of a multiplicity of on-chip RAMs or on-chip registers that are disposed ubiquitously in a data processor such as a one-chip microcomputer. The following describes applications of the above-described SRAM configuration on a one-chip microcomputer designed as a data processor.

Figure 21:
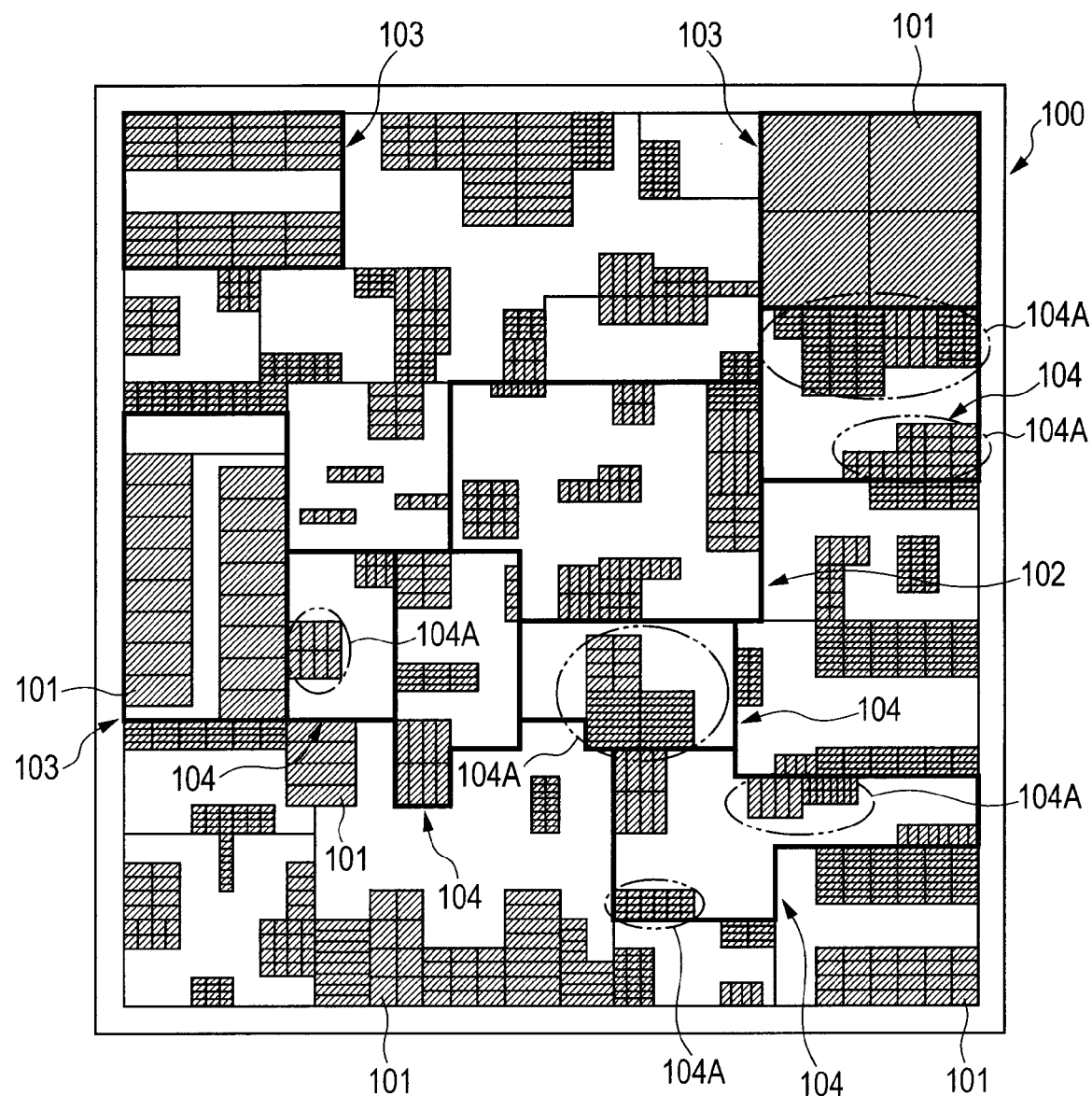
FIG. 21 is a plan view illustrating a planar layout arrangement of a microcomputer according to the present invention.

Referring to FIG. 21, there is shown an exemplary planar layout arrangement of a single-chip microcomputer 100 according to the present invention.

The single-chip microcomputer 100 is configured using a semiconductor substrate such as a single-crystal silicon chip through complementary MOS integrated circuit fabrication processes, for example. In FIG. 21, the hatched parts identified by reference numeral 101 represent SRAMs included in memory and register regions, which are disposed ubiquitously in the entire chip area. These SRAMs are different in size (storage capacity) and are used for a variety of purposes. In FIG. 21, reference numeral 102 indicates a CPU for fetching and carrying out instructions, reference numeral 103 indicates a first memory block to be accessed by the CPU 102, and reference numeral 104 indicates a data processing unit such as an accelerator that includes a second memory block 104A and is arranged to perform data processing operations under control of the CPU 102.

The SRAMs 101 that are disposed ubiquitously in the entire chip area and contained in the first and second memory blocks 103 and 104A provide the advantageous effects described hereinabove. Hence, in the formation of the single-chip microcomputer 100 wherein a write margin is enhanced with the provision of a multiplicity of the first and second memory blocks 103 and 104A, i.e., a multiplicity of the SRAMs 101, it is possible to obviate an increase in physical chip size.

Figure 22:
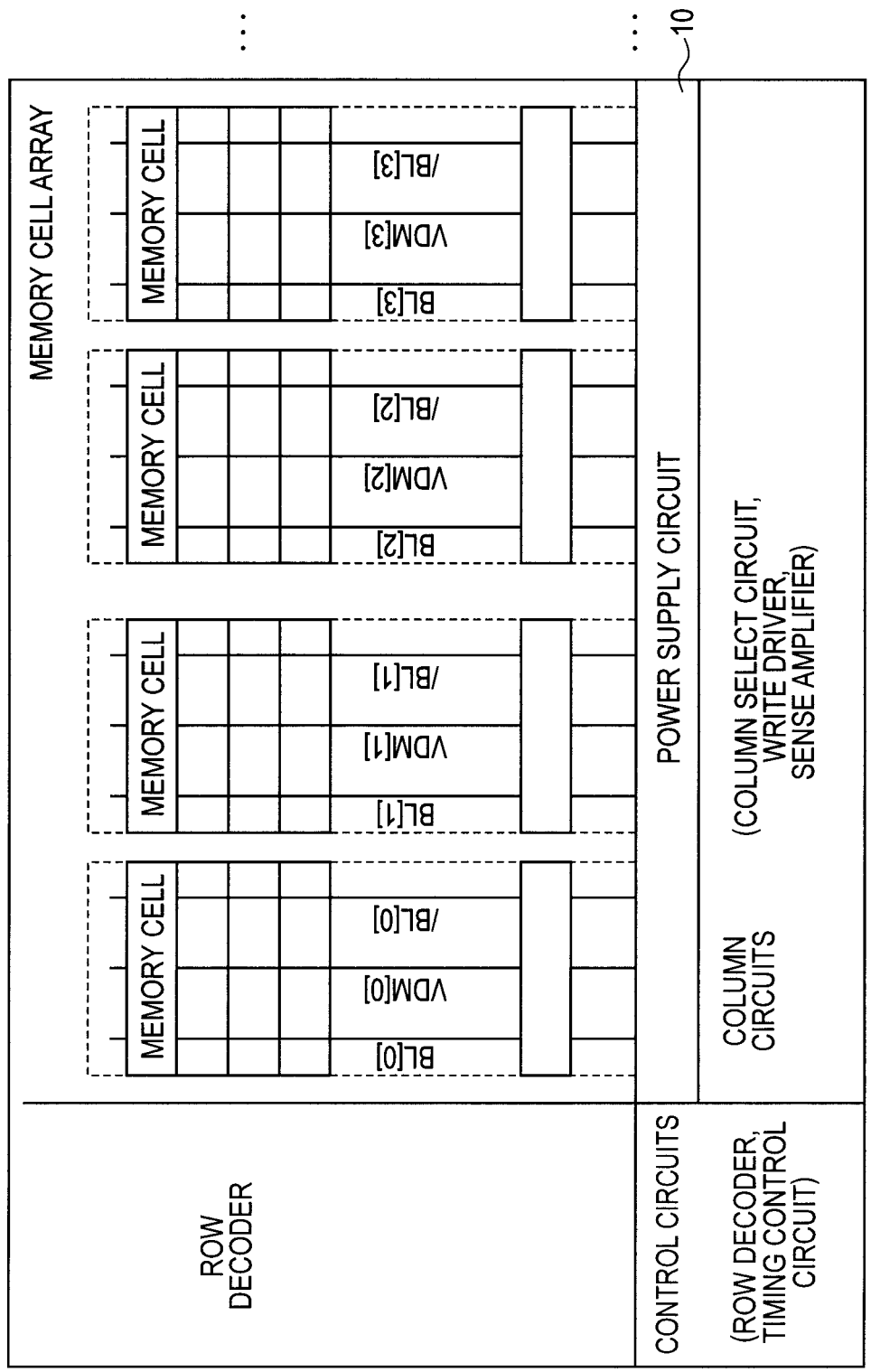
FIG. 22 is a plan view illustrating an SRAM layout pattern.

Referring to FIG. 22, there is shown a layout pattern of the SRAM 101. In terms of area efficiency, it is advantageous to dispose the power supply circuit identified by reference numeral 10 between column circuits (column circuitry) and memory cell arrays on account of the condition that the power supply circuit 10 frequently uses column select signals for switching operation.

Figure 23:
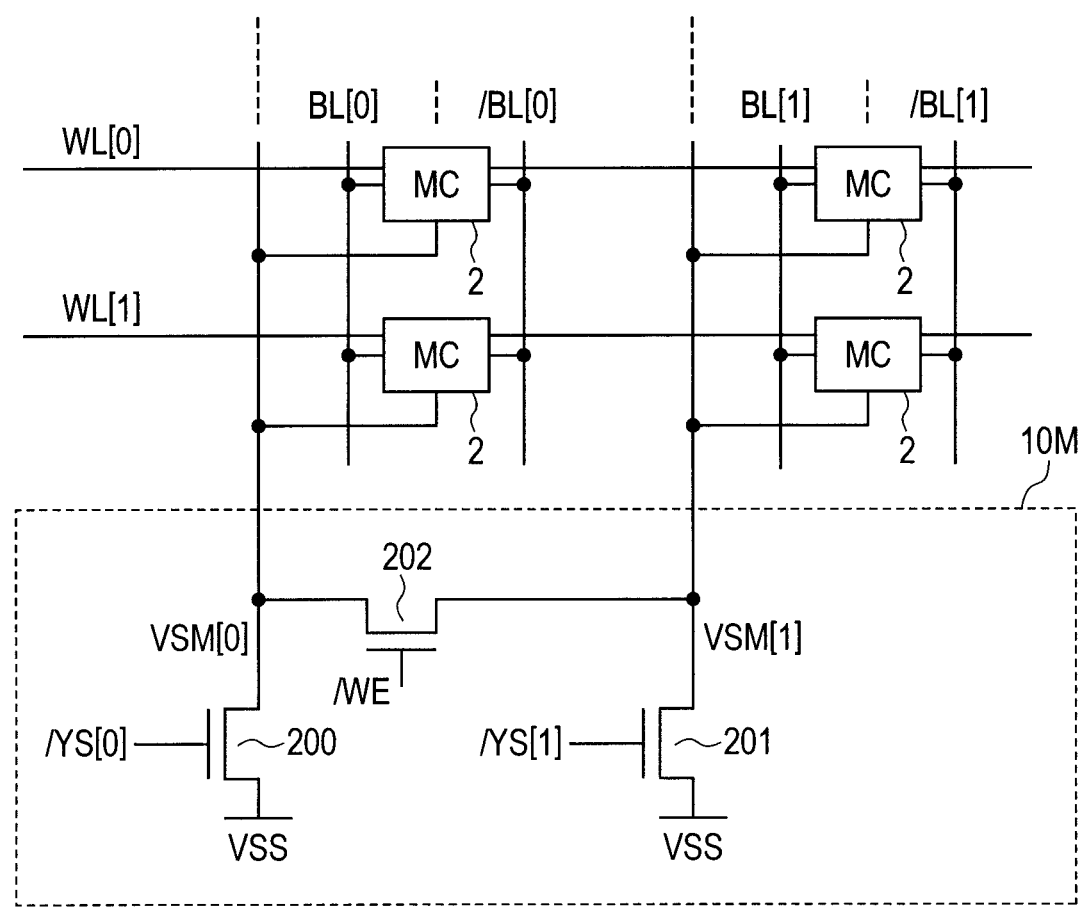
FIG. 23 is a circuit diagram illustrating a configuration wherein a power supply circuit is disposed in a path to a ground voltage terminal.

Referring to FIG. 23, there is shown an exemplary configuration wherein a power supply circuit 10M is disposed in a path to a ground voltage terminal. Each of power supply lines VSM[0] and VSM[1] indicated representatively is extended along a path from memory cells 2 to a ground voltage terminal VSS. Each of power switches 200 and 201 is formed by using an n-channel MOS transistor so as to perform switching control according to the inverted signals /YS[0] and /YS[1] of the column select signals YS[0] and YS[1]. A short-circuit switch 202 is formed by using an n-channel MOS transistor so as to perform switching control according to the inverted signal /WE of the write enable signal WE. Since the power supply circuit 10M performs control operation in a manner similar to that described above, no duplicative description thereof is not given here. Thus, it is possible to provide advantageous effects similarly to the cases described above.

Figure 24:
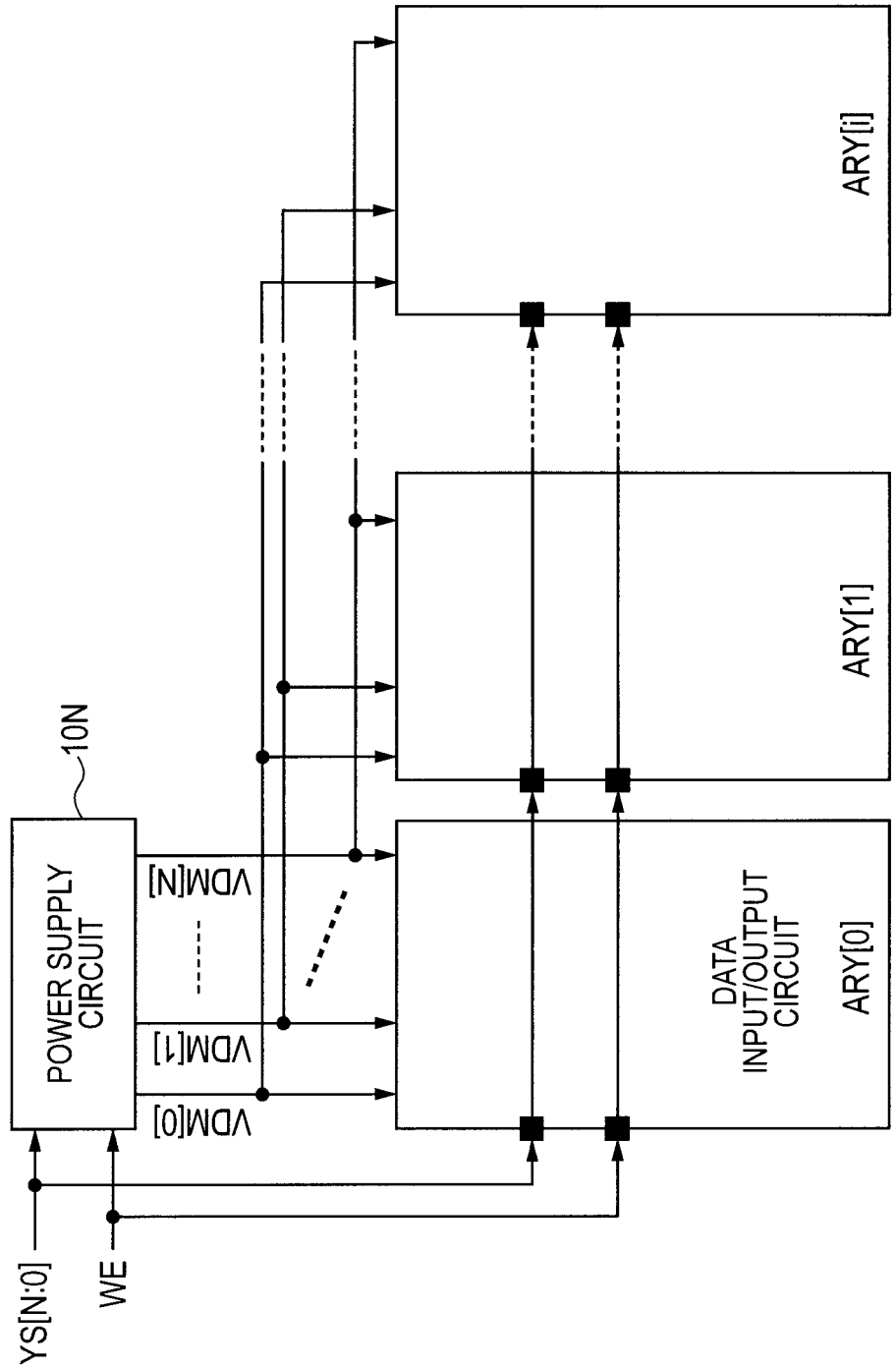
FIG. 24 is a block diagram illustrating a configuration wherein a power supply circuit is used in common for data bits in a plural-bit parallel input/output scheme.

Referring to FIG. 24, there is shown an exemplary configuration wherein a power supply circuit 10N is used in common for data bits in a plural-bit parallel input/output scheme. In this configuration, power supply lines VDM[0] to VDM[N] are coupled in common for memory cell array areas ARY[0] to ARY[i] corresponding to input/output data bits IO[0] to IO[i].

While the present invention made by the present inventors has been described in detail with respect to specific embodiments thereof, it is to be understood that the present invention is not limited by any of the details of description and that various changes and modifications may be made in the present invention without departing from the spirit and scope thereof.

For example, in a semiconductor integrated circuit device, a variety of implementations are possible regarding the numbers of word lines and bit lines included in memory cell arrays of the SRAM according to the present invention. It will be obvious to those skilled in the art that the present invention is applicable to SRAMs incorporated in a system LSI and also to general-purpose SRAMs in a similar fashion. Thus, the present invention has extensive applicability to various semiconductor integrated circuit devices including SRAMS therein.

What is claimed is:

1. A semiconductor device comprising:
   a plurality of word lines;
   a plurality of complementary bit lines;
   a plurality of static memory cells disposed correspondingly to the word lines and the complementary bit lines;
   an address decoder that decodes address signals to produce complementary bit line select signals;
   a write circuit that feeds a write signal to each memory cell from a complementary bit line selected by a complementary bit line select signal;
   a plurality of power supply lines that feed a power supply voltage to each group of memory cells which use the complementary bit lines in common;
   a plurality of power switches, each being disposed for each power supply line corresponding to a complementary bit line selected by a complementary bit line select signal for use in common at least, and being so arranged as to be put in an ON state when an unselected level is indicated by the complementary bit line select signal concerned or in an OFF state when a selected level is indicated thereby; and
   a plurality of short-circuit switches, each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least.

2. The semiconductor device according to claim 1, further comprising:
   a plurality of redundant short-circuit switches each being series-coupled to the short-circuit switch;
   wherein the redundant short-circuit switch is disposed for providing coupling between an output node of each power switch and an output node of at least one of the other power switches, and is so arranged as to be put in an OFF state in response to a write operation instruction from the write circuit or in an ON state in response to a write non-operation instruction therefrom.

3. The semiconductor device according to claim 1, further comprising:
a plurality of retention switches, each being disposed in parallel with the power switch so as to provide a mutual conductance smaller than that of the power switch;
wherein, with the power switch in an OFF state at least, a retention current for data stored in memory cells is fed to a corresponding power supply line.

4. The semiconductor device according to claim 1, further comprising:
a series circuit that includes a plurality of first transistors disposed in parallel with the power supply lines for performing complementary switching operation with respect to corresponding power switches, and a plurality of second transistors for performing complementary switching operation with respect to corresponding short-circuit switches,
wherein, in a conducting state, the series circuit feeds a retention voltage to corresponding power supply lines for ensuring data retention in memory cells.

5. The semiconductor device according to claim 4,
wherein each of the first transistors is disposed for each power supply line, and each of the second transistors is arranged for use in common to the first transistors.

6. The semiconductor device according to claim 1,
wherein each of the short-circuit switches is disposed between mutually adjacent power supply lines.

7. The semiconductor device according to claim 1,
wherein each of the power switches and the short-circuit switches is formed by using a p-channel MOS transistor, the power supply voltage is a positive potential voltage higher than a circuit ground voltage, and the power supply circuit is disposed in the course of a path for feeding the power supply voltage to the memory cells; and
wherein each of the memory cells includes a memory part in which inputs and outputs of two CMOS inverter circuits are cross-coupled, and a pair of address selection MOSFET transistors each being disposed between the memory part and the complementary bit line with a gate thereof coupled to the word line.

8. The semiconductor device according to claim 1,
wherein each of the power switches and the short-circuit switches is formed by using an n-channel MOS transistor, the power supply voltage is a circuit ground voltage lower than a positive potential voltage, and the power supply circuit is disposed in the course of a path for drawing a current from the memory cells with respect to the power supply voltage; and
wherein each of the memory cells includes a memory part in which inputs and outputs of two CMOS inverter circuits are cross-coupled, and a pair of address selection MOSFET transistors each being disposed between the memory part and the complementary bit line with a gate thereof coupled to the word line.

9. A semiconductor device comprising:
a plurality of word lines;
a plurality of complementary bit lines;
a plurality of static memory cells disposed correspondingly to the word lines and the complementary lines;
an address decoder that decodes address signals to produce complementary bit line select signals for parallel selection of a plurality of complementary bit lines;
a write circuit that feeds a write signal to each memory cell from a complementary bit line selected by a complementary bit line select signal, with the exclusion of complementary bit lines that are write-inhibited under the direction of a mask signal;
a plurality of power supply lines that feed a power supply voltage to each group of memory cells that use the complementary bit lines in common;
a plurality of power switches, each being disposed for each power supply line corresponding to a complementary bit line selected by a complementary bit line select signal for use in common at least, and being so arranged as to be put in an ON state when an unselected level is indicated by the complementary bit line select signal concerned or in an OFF state when a selected level is indicated thereby;
a plurality of first short-circuit switches, each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least; and
a plurality of second short-circuit switches, each being disposed in parallel with each of the first short-circuit switches, and being so arranged as to be put in an ON state in response to a masking instruction by a corresponding mask bit of the mask signal or in an OFF state in response to an unmasking instruction thereby.

10. A data processor comprising:
a CPU that fetches and carries out instructions;
a first memory block to be accessed by the CPU; and
a data processing unit including a second memory block and being arranged to perform data processing operations under control of the CPU;
wherein each of the first memory block and the second memory block comprises:
a plurality of word lines;
a plurality of complementary bit lines;
a plurality of static memory cells disposed correspondingly to the word lines and the complementary bit lines;
an address decoder that decodes address signals to produce complementary bit line select signals;
a write circuit that feeds a write signal to each memory cell from a complementary bit line selected by a complementary bit line select signal;
a plurality of power supply lines that feed a power supply voltage to each group of memory cells that use the complementary bit lines in common;
a plurality of power switches, each being disposed for each power supply line corresponding to a complementary bit line selected by a complementary bit line select signal for use in common at least, and being so arranged as to be put in an ON state when an unselected level is indicated by the complementary bit line select signal concerned or in an OFF state when a selected level is indicated thereby; and
a plurality of short-circuit switches, each being disposed for providing coupling between an output node of each power switch and an output node of at least one of the other power switches, and being so arranged as to be put in an OFF state in response to a write operation instruction from the write circuit or in an ON state in response to a write non-operation instruction therefrom, where the output nodes of the power switches to be coupled mutually are arranged to correspond to complementary bit lines selected by different complementary bit line select signals at least.

11. The data processor according to claim 10, wherein the data processing unit is an accelerator used for the CPU.

12. The data processor according to claim 10, wherein the data processor is a microcomputer configured in the form of a single semiconductor chip.

* * * * *